(12) United States Patent
King et al.

(10) Patent No.: US 6,340,788 B1
(45) Date of Patent: Jan. 22, 2002

(54) MULTIJUNCTION PHOTOVOLTAIC CELLS AND PANELS USING A SILICON OR SILICON-GERMANIUM ACTIVE SUBSTRATE CELL FOR SPACE AND TERRESTRIAL APPLICATIONS

(75) Inventors: Richard R. King, Newbury Park; Nasser H. Karam, Northridge; Moran Haddad, Winnetka, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/454,063

(22) Filed: Dec. 2, 1999

(51) Int. Cl.$^7$ ................................................ H01L 31/00
(52) U.S. Cl. ........................................ 136/261; 136/255
(58) Field of Search .................................. 136/261, 255

(56) References Cited

U.S. PATENT DOCUMENTS

| | | | |
|---|---|---|---|
| 4,017,332 A | 4/1977 | James | 136/249 |
| 4,255,211 A | 3/1981 | Fraas | 136/249 |
| 4,332,974 A | 6/1982 | Fraas | 136/249 |
| 5,100,478 A | 3/1992 | Kawabata | 136/249 |
| 5,322,573 A | 6/1994 | Jain et al. | 136/252 |
| 5,407,491 A | 4/1995 | Freundlich et al. | 136/249 |
| 5,800,630 A | 9/1998 | Vilela et al. | 136/249 |
| 5,944,913 A * | 8/1999 | Hgou et al. | 136/255 |
| 6,147,296 A * | 11/2000 | Freundlich | 136/255 |

OTHER PUBLICATIONS

Ejeckam, et al., Lattice engineered compliant substrate for defect-free heteroepitaxial growth, Appl. Phys. Lett. 70(13), Mar. 31, 1997, pp. 1685–1687, New York.

Hayashi, et al., MOCVD Growth of GaAsP on Si for Tandem Solar Cell Application, First WCPEC, Dec. 5–9, 1994, pp. 1890–1893, Hawaii.

Kurtz, et al., Modeling of two–junction, series–connected tandem solar cells using top–cell thickness as an adjustable parameter, J. Appl. Phys. 68(4), Aug. 15, 1990, pp. 1890–1895, Golden, Colorado.

Okada, et al., Growth of GaAs and AlGaAs on Si Substrates by Atomic Hydrogen–assisted MBE (H–MBE) for Solar Cell Applications, First WCPEC, Dec. 5–9, 1994, pp. 1701–1704, Hawaii.

Wojtczuk, et al, Development of InP Solar Cells on Inexpensive Si Wafers, First WCPEC, Dec. 5–9, 1994, pp. 1705–1708, Hawaii.

* cited by examiner

Primary Examiner—Mark Chapman
(74) Attorney, Agent, or Firm—Terje Gudmestad

(57) ABSTRACT

An improved photovoltaic cell has an active silicon (Si) or silicon-germanium (SiGe) substrate subcell having an active upper side and characterized by a substrate bandgap. One or more upper subcells are disposed adjacent the upper side and current matched with the substrate subcell, with the upper subcell(s) typically having bandgap(s) greater than the substrate bandgap. A transition layer may be placed intermediate the upper side and the upper subcell(s).

93 Claims, 7 Drawing Sheets

MULTIJUNCTION PHOTOVOLTAIC CELLS AND PANELS USING A SILICON OR SILICON-GERMANIUM ACTIVE SUBSTRATE CELL FOR SPACE AND TERRESTRIAL APPLICATIONS

BACKGROUND OF THE INVENTION

1. Field of the Invention

The present invention generally relates to photovoltaic cells and, more particularly, to an improved photovoltaic cell having an active silicon or silicon-germanium substrate subcell that results in improved adaptability, yield and efficiency.

2. Description of Related Art

The interest in photovoltaic (PV) cells continues as concerns over pollution and limited resources continue. The continued interest has been in both terrestrial and non-terrestrial applications. In the non-terrestrial environment of outer space, the concern over limited resources of any type is a major one. This is because the need to increase the amount of a resource increases the payload. An increased payload can increase the cost of a launch more than linearly. With the ready availability of solar energy in outer space for a spacecraft such as a satellite, the conversion of solar energy into electrical energy is an obvious alternative to increased payload.

The cost per watt of electrical power generation capacity of photovoltaic systems is the main factor which inhibits their widespread use in terrestrial applications. Conversion efficiency of sunlight to electricity is of critical importance for terrestrial photovoltaic systems, since increased efficiency means that all area-related components of the electricity generation system, i.e., cell area, module or collector area, support structures, land area, etc., can be reduced when the efficiency is increased, for a given required power output of the system. For example, in concentrator photovoltaic systems which concentrate the sunlight, typically from 2 to 2000 times, onto the photovoltaic cell, an increase in efficiency means that the area of the expensive concentrating optics can be reduced proportionally. Concentrator photovoltaic systems are a likely application of the multijunction cells described in this invention, because the cell area can be reduced by the concentration ratio, allowing the use of relatively complicated solar cells with a high cost per unit area.

Irrespective of the application, and as with any energy generation system, efforts have been ongoing to increase the output and/or efficiency of PV cells. In terms of output, multiple cells or layers having different energy bandgaps have been stacked so that each cell or layer can absorb a different part of the wide energy distribution of photons in sunlight. The stacked arrangement has been provided in a monolithic structure on a single substrate or on multiple substrates. Examples of multi-cell devices are shown in Kurtz et al., "Modeling of two-junction, series-connected tandem solar cells using top-cell thickness as an adjustable parameter," J. Appl. Phys. 68(4), pp. 1890–1895, Aug. 15, 1990; and U. S. Pat. Nos. 5,800,630; 5,407,491; 5,100,478; 4,332,974; 4,225,211; and 4,017,332.

In the multiple cell device, semiconductive materials are typically lattice-matched to form multiple p-n (or n-p) junctions. The p-n (or n-p) junctions can be of the homo-junction or heterojunction type. When solar energy is received at a junction, minority carriers (i.e., electrons and holes) are generated in the conduction and valence bands of the semiconductor materials adjacent the junction. A voltage is thereby created across the junction and a current can be utilized therefrom. As the solar energy passes to the next junction which has been optimized to a lower energy range, additional solar energy at this lower energy range can be converted into a useful current. With a greater number of junctions, there can be greater conversion efficiency and increased output voltage.

For the multiple-cell PV device, efficiency is limited by the requirement of low resistance interfaces between the individual cells to enable the generated current to flow from one cell to the next. Accordingly, in a monolithic structure, tunnel junctions have been used to minimize the blockage of current flow. In a multiple wafer structure, front and back metallization grids with low coverage fraction and transparent conductors have been used for low resistance connectivity.

Another limitation to the multiple cell PV device is that current output at each junction must be the same for optimum efficiency in the series-connected configuration. Also, there is a practical limit on the number of junctions, since each successive junction generates a smaller current.

Whether in the multiple-junction or single-junction PV device, a conventional characteristic of PV cells has been the use of a single window layer on an emitter layer disposed on a base/substrate, which is shown for example in U.S. Pat. No. 5,322,573. Similarly, a single layer back-surface field structure below the base/substrate has been used, as shown in U.S. Pat. No. 5,800,630. The purpose of the back-surface field structure has been to serve as a passivation layer, like the single window layer described above.

The concern over efficiency in PV cells has created more interest in the use of germanium, gallium arsenide, indium phosphide, and gallium indium phosphide, all of which have been thought to be more efficient than silicon. Indium phosphide has another perceived advantage of being radiation resistant, which is of particular benefit in space applications. However, silicon is stronger, less expensive, and less than half as dense as Ge and GaAs substrates. Accordingly, silicon remains highly viable for continued use and is discussed, for example, in Hayashi et al., "MOCVD Growth of GaAsP on Si For Tandem Solar Cell Application," First WCPEC, pp. 1890–1893 (1994) and Wojtczuk et al., "Development of InP Solar Cells on Inexpensive Si Wafers," First WCPEC, pp. 1705–1708 (1994).

As can be seen, there is a need for an improved multi-function photovoltaic cell that is thinner and lighter than conventional solar cells, which has increased efficiency, yield, and adaptability to different applications.

SUMMARY OF THE INVENTION

The present invention is generally directed to an improved multijunction photovoltaic cell in which a pure silicon or silicon-germanium or pure germanium substrate serves as an active subcell. The active substrate can be located at the top, bottom, or an intermediate position within the cell. The active substrate has the ability to provide photogenerated current density and voltage in addition to structural support. The individual subcells that make up the multijunction solar cell may be of the heterojunction or homojunction types, and may have either an n-on-p or a p-on-n configuration.

In a series-interconnected multijunction photovoltaic cell, a design consideration of critical importance is for each subcell to have roughly the same photogenerated current density, so that the cell with the lowest photogenerated current density does not limit the current flowing through the other subcells in the multijunction cell. Accordingly, an important component of this invention is the selection of the number of subcells above and below the substrate subcell, and selection of the combination of bandgaps of each subcell determined by the choice of subcell composition and lattice constant, in order to achieve current matching with the substrate which is preferably composed of silicon (Si) or silicon-germanium (SiGe) or germanium (Ge). More preferably, the substrate is composed of Si or SiGe.

In the present invention, the active silicon or silicon-germanium or germanium substrate typically has one side which is more responsive to incident light than the opposite side, and this side is referred to as the "active side" in the description that follows. Note, however, that the opposite side can also have some degree of photoresponsivity to light incident on it. The active side of the substrate is typically the side closest to the voltage-producing p-n junction in the substrate.

Specifically, in one embodiment of the present invention, the improved photovoltaic cell includes an active silicon (Si) or silicon-germanium (SiGe) or germanium (Ge) substrate having one active side and characterized by a substrate bandgap; one or more subcells are disposed adjacent either the active side or the opposite side and current matched with the substrate, a transition layer intermediate the active side and the side of the subcell closest to it; and a transition layer between adjacent subcells if there is more than one subcell.

In a another embodiment, the photovoltaic cell of the present invention includes an active Si or SiGe or Ge substrate having an active upper side and characterized by a substrate bandgap; one or more lower subcells disposed adjacent the lower side and current matched with the substrate, with the lower subcell(s) typically having lower bandgap(s) than the substrate bandgap; and a transition layer intermediate the lower side and the lower subcell(s).

In still another embodiment, the improved photovoltaic cell includes an active Si or SiGe or Ge substrate having an active upper side and characterized by a substrate bandgap; one or more upper subcells disposed adjacent the upper side and current matched with the substrate, with the upper subcell(s) typically having bandgap(s) greater than the substrate bandgap; one or more lower subcells disposed adjacent the lower side of the substrate and current matched with the substrate, with the lower subcell(s) typically having lower bandgap(s) than the substrate bandgap; a transition layer intermediate the upper side and the upper subcell(s); as well as a transition layer intermediate the lower side and the lower subcell(s).

In a further embodiment, the photovoltaic cell of the present invention includes an active Si, SiGe, or Ge substrate characterized by a substrate bandgap that is lower than or equal to that of a pure silicon substrate and a substrate lattice constant that is larger than or equal to that of pure silicon; one or more upper subcells disposed adjacent the upper side of the substrate and current matched with the substrate, with the upper subcell(s) typically having bandgap (s) greater than the substrate bandgap; and zero, one, or more lower subcells disposed adjacent the lower side of the substrate and current matched with the substrate, with the lower subcell(s) typically having lower bandgap(s) than the substrate bandgap. The semiconductor materials of the upper and lower subcells are selected to have approximately the same lattice constant as the Si or SiGe or Ge substrate. In this embodiment, therefore, transition layers are not required to change from the lattice constant of the substrate to the lattice constant of the semiconductor materials in the upper and lower subcells. The case with no upper subcells, and one or more lower subcells lattice-matched to the active Si or SiGe or Ge substrate, is also included in this embodiment.

In yet another embodiment, the photovoltaic cell of the present invention includes an active Si, SiGe, or Ge substrate characterized by a substrate bandgap that is lower than or equal to that of a pure silicon substrate and a substrate lattice constant that is larger than or equal to that of pure silicon. Two or more groups of upper subcells, with each group in general having a lattice constant different from the substrate and different from the other subcell groups, are positioned above the upper surface of the active substrate, with a transition layer between each of the subcell groups, and between the lowermost subcell group and the substrate. As in the previous embodiments, the transition layers serve to change the lattice constant from one region of the multijunction cell, i.e. the substrate or one of the subcell groups, to the lattice constant of the adjacent subcell group. The ability to choose lattice constant of each group of subcells allows greater flexibility in the choice of bandgap of the subcells, which in turn facilitates matching the photogenerated current density of each subcell in the multifunction cell for a given spectrum of incident light. This combination of two or more groups of upper subcells with different lattice constants and two or more lattice-constant-transitioning layers can also be combined with the lower subcell configurations described in the previous embodiments.

In an additional embodiment, the photovoltaic cell of the present invention again includes an active Si, SiGe, or Ge substrate characterized by a substrate bandgap that is lower than or equal to that of a pure silicon substrate and a substrate lattice constant that is larger than or equal to that of pure silicon. Two or more groups of lower subcells, with each group in general having a lattice constant different from the substrate and different from the other subcell groups, are positioned below the lower surface of the active subcell, with a transition layer between each of the subcell groups, and between the uppermost subcell group and the substrate. This combination of two or more groups of lower subcells with different lattice constants and two or more lattice-constant-transitioning layers can also be combined with the upper subcell configurations described in the previous embodiments.

These and other features, aspects and advantages of the present invention will become better understood with reference to the following drawings, description, and claims.

DESCRIPTION OF THE PREFERRED EMBODIMENTS

The improved monolithic multijunction photovoltaic cell of the present invention is described below in various embodiments. In general, however, the photovoltaic cell of the present invention includes a Si or SiGe or Ge substrate that serves as an active subcell. The Si or SiGe or Ge substrate can be operatively placed at the top, bottom, or intermediate positions within the photovoltaic cell. In many, but not all, of the preferred embodiments, a transition layer is provided between the active substrate and the other active subcells in the multijunction photovoltaic cell. The transition layers are generally intended to minimize the adverse affects of dislocation densities resulting from lattice constant mismatches and coefficient of thermal expansion mismatches.

Figure 6:
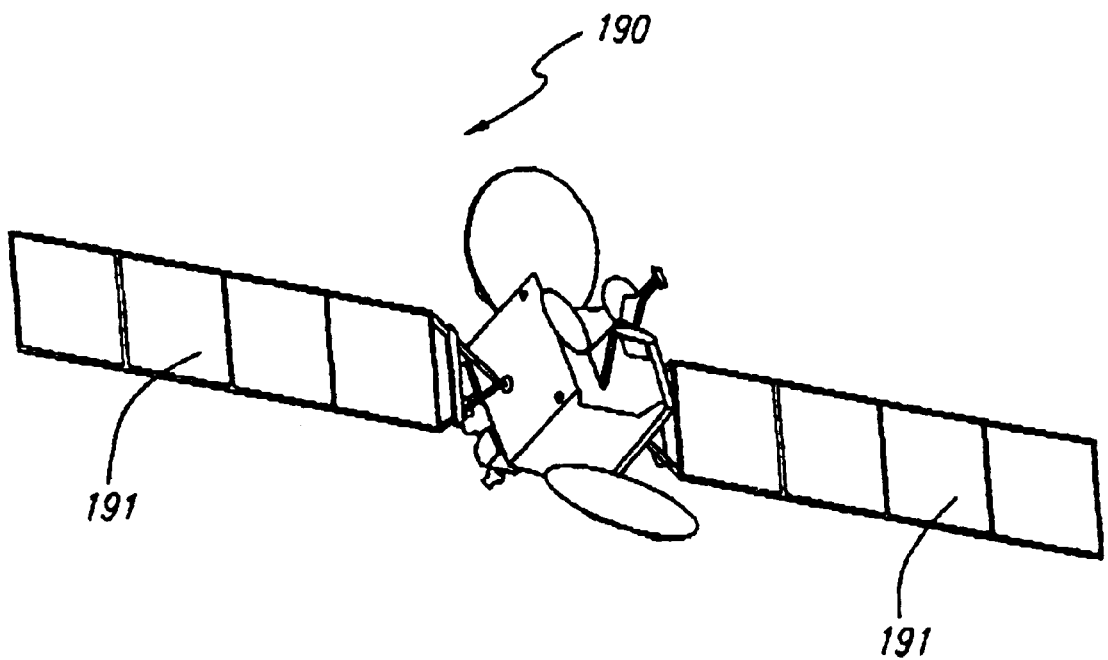
FIG. 6 depicts a solar panel of a satellite on which the present invention may be utilized.

Furthermore, while the present invention may be particularly useful in the context of spacecraft, such as in a solar panel 191 of a satellite 190 (FIG. 6), other applications—both terrestrial and non-terrestrial—are contemplated. Still further, even though the present invention is described in the context of a photovoltaic cell, the invention is not so limited. Other contexts, such as sensors and other optoelectronic devices, are contemplated to be within the scope of the present invention.

Given the breadth of contexts of the present invention, it can be appreciated by those skilled in the art that the different semiconductor layers that form the photovoltaic cell of the present invention can be made by many well-known processes in the art, such as molecular beam epitaxy (MBE), liquid phase epitaxy (LPE), metal-organic chemical vapor deposition (MOCVD), and conventional wafer bonding of the already-grown semiconductor layers of the upper subcells to the active Si or SiGe or Ge substrate. In accordance with such known methods, the specific materials comprising the semiconductor layers may be altered and optimized to meet the requirements of the particular context.

Figure 1A:
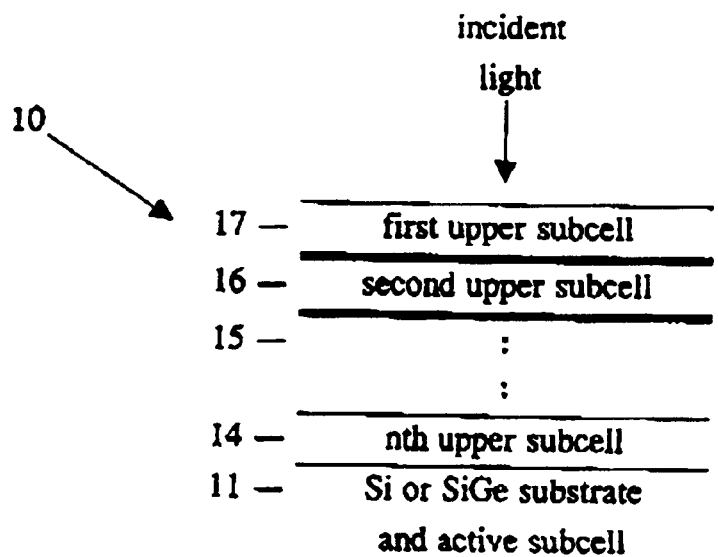
FIG. 1a is a schematic diagram of a monolithic multi-junction photovoltaic cell according to a first embodiment of the present invention.

A first embodiment of a photovoltaic cell 10 according to the present invention is schematically depicted in FIG. 1a. The cell 10 can receive incident light that passes through an antireflection layer or coating (not shown) that is disposed on top of the cell 10, as viewed from FIG. 1a. The antireflection layer is intended to minimize surface reflections between the optically transparent media above the cell (such as air, glass, or polymer) and the semiconductor layers of the cell 10, thereby enabling more photons to enter the cell 10. The antireflection layer can be made from well-known materials in the art, such as $TiO_2$, $Ta_2O_5$, $SiO_2$, and $MgF_2$. The thickness of the antireflective coating can vary, but is typically between about 0.04 and 0.35 microns.

The photovoltaic cell 10 includes a Si or SiGe substrate 11 that is located at a bottom position of the cell 10, when viewed from FIG. 1a. The substrate 11 is an "active" subcell, as opposed to an "inactive" one. The distinction refers to the ability of the subcell 11 to provide photogenerated current density and voltage in addition to structural support, as compared to simply providing support. Accordingly, the substrate 11 has an active side, which is typically the side or surface closest to the p-n junction of the substrate subcell 11, and is typically the side or surface that receives the incident light. In the embodiment shown in FIG. 1a, the active side of the substrate 11 is the upper side or surface when viewed from FIG. 1a.

Given its active function, the active substrate 11 is formed with a p-n junction. The polarity of this p-n junction may be oriented such that the n-type region is above the p-type region (n-on-p configuration), or such that the p-type region is above the n-type region (p-on-n configuration). The particular semiconductor layers used to form the p-n junction can vary according to practices well-known in the art. For either polarity of p-n junction in the substrate 11, the top layer (i.e., the emitter of the active substrate 11) can be made, for example, of Si, SiGe, GaAs, GaPAs, GaInP, or GaInPAs. This top layer is n-type in the n-on-p configuration and p-type in the p-on-n configuration. The lower region of the p-n junction (i.e., the base of the active substrate 11) for either polarity is composed of the of the active substrate 11. This lower region (which can be the bulk of the substrate or a doped region of the substrate) is p-type in the n-on-p configuration and n-type in the p-on-n configuration.

The top layer of the p-n junction can be formed by: (1) epitaxial growth on the active substrate; (2) dopant diffusion or ion implantation to form the top, doped layer in the active substrate, before subsequent epitaxial growth; or (3) diffusion of species that act as dopants in the active substrate from the epitaxial layers grown on top of the active substrate. In one preferred configuration, the top layer is an n-type Si or SiGe layer, formed in a p-type Si or SiGe substrate by diffusion of group-V elements such as phosphorus, arsenic, or antimony, into the substrate prior to the growth of epitaxial layers on the substrate to form the other subcells in the multijunction photovoltaic cell 10. In a second preferred configuration, the top layer is an n-type Si or SiGe layer, formed in a p-type Si or SiGe substrate by diffusion of group-V elements such as phosphorus, arsenic, or antimony, into the substrate during epitaxial growth of III–V compounds on the Si or SiGe substrate.

In general, the particular dopant used can vary according to well-known methods in the art. If, as in the particular preferred configurations described above, the substrate 11 is made with an n-type Si or SiGe layer doped with phosphorus, arsenic, or antimony, then the p-type Si or SiGe substrate can be doped with group-III elements such as boron, aluminum, gallium, or indium. The dopant concentration can also vary, but will typically be from about $10^{18}$ to $10^{21}$ cm$^{-3}$ (and preferably about $3\times10^{18}$ to $10^{20}$ cm$^{-3}$) in the top layer (i.e., the emitter of the substrate 11). The dopant concentration in the bottom layer (i.e., the base of the substrate 11) can range from nearly intrinsic (around $10^{13}$ cm$^{-3}$) to about $10^{19}$ cm$^{-3}$ (and is preferably about $10^{15}$ to $3\times10^{18}$ cm$^{-3}$).

Just as the types of materials and dopants can vary for the semiconductor layers in the substrate 11, their thicknesses can also vary. Typically, however, the overall thickness of substrate 11, in this embodiment, may range from about 25 to 1000 $\mu$m, although preferably about 100 to 400 $\mu$m. The thickness of the upper layer of the p-n junction in the substrate 11 may range in thickness from about 0.05 to 5 $\mu$m, and is preferably about 0.1 to 1 $\mu$m. With the above thickness ranges for the upper layer of the p-n junction, the thickness of the lower layer of the p-n junction (in the case that it is formed from the bulk of the substrate) therefore has about the same thickness range as the entire substrate. The subcell 11 formed from the Si or SiGe substrate is also characterized by an energy bandgap $E_g$ that can vary from that of Si ($E_g$=1.12 eV) to that of Ge ($E_g$=0.67 eV) and all points in between, depending on the Si and Ge compositions in the SiGe substrate.

Figure 1B:
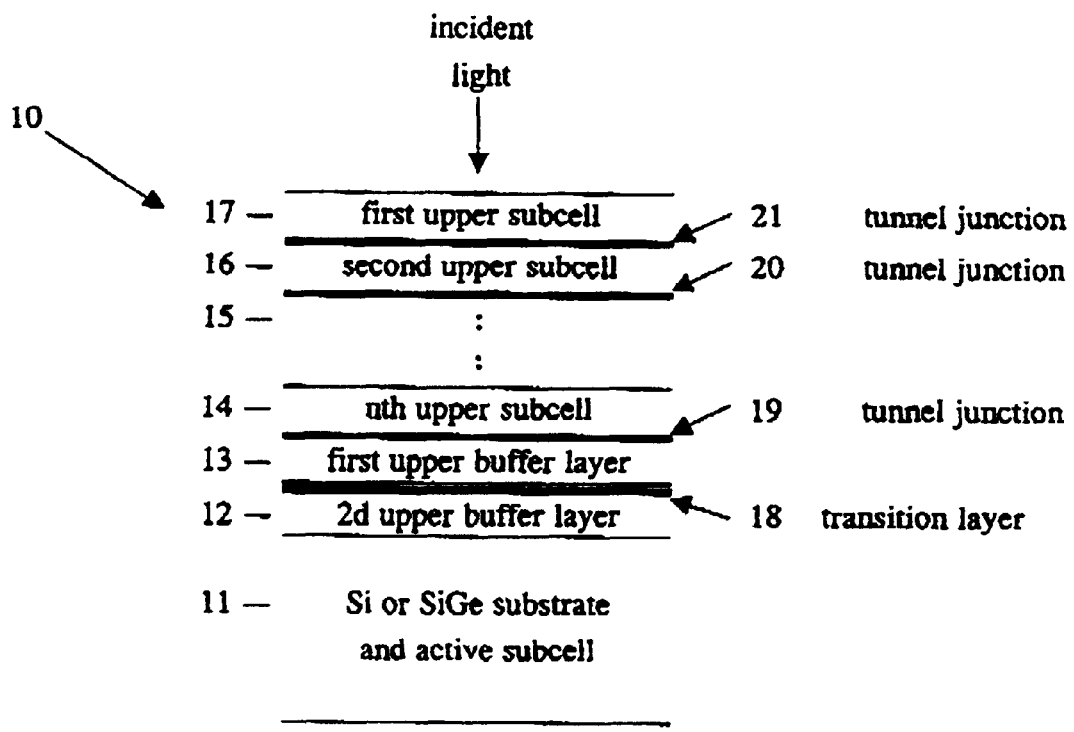
FIG. 1b is a schematic diagram of a monolithic multi-junction photovoltaic cell according to a variation of the first embodiment of the present invention.

In a variation of the embodiment shown in FIG. 1a, FIG. 1b depicts an embodiment wherein a second upper buffer layer 12, a transition layer 18, and a first upper buffer layer 13 are adjacent the active side of the active substrate 11. In general, however, the buffer layer 12, the buffer layer 13, or both, and the transitional layer 18 are optional and can be absent from the cell 10. The number of upper subcells may range from 1 to n, where n is an integer. As mentioned above, the transition layer 18 serves to achieve current matching in the subcells of the photovoltaic cell 10 by allowing the growth of semiconductor compositions that have the appropriate bandgaps for current matching of the subcells, while minimizing the adverse effects of dislocation densities resulting from lattice-constant mismatches and mismatches in the coefficient of thermal expansion. As used herein, the dislocation density is that which would otherwise occur between the substrate 11 and an $n^{th}$ upper subcell 14 in the absence of the transition layer 18. The $n^{th}$ upper subcell 14 is the lowermost subcell in a plurality of upper subcells 14 to 17, as illustrated in FIGS. 1a and 1b.

The transition layer 18 can be made according to well-known methods in the art. For example, the transition layer 18 can be a strained-layer superlattice, a layer with step-graded composition, a layer with continuously-graded composition, or a layer with multiple strain-balanced sublayers. These and similar types of transition layers may be grown under irradiation with atomic hydrogen to minimize the dislocation density, as described in Okada et al., "Growth of GaAs and AlGaAs on Si Substrates by Atomic Hydrogen-Assisted MBE (H-MBE) for Solar Cell Applications, First WCPEC, pp. 1701–1704 (1994). The transition layer 18 may be formed by a compliant layer that is soft at the temperatures of epitaxial growth, but which can still serve as a template for the nucleation of crystal growth, such as borosilicate glass. The transition layer 18 may consist of a dielectric or other material resistant to high temperature, with vias etched through it to the layer underneath (either the upper buffer layer 12 or the top of the substrate 11). Single-crystal growth of a semiconductor is nucleated selectively in the vias, the epitaxial growth continues out of the vias and laterally over the dielectric or other temperature resistant layer, until a continuous semiconductor film is formed over the transition layer 18. The grown semiconductor in the unit cell around each via is single-crystal material with the same crystal orientation as the material around each of the other vias, providing a suitable template for epitaxial growth of the subsequent semiconductor layers to form the other subcells 14–17 in the multifunction cell 10. Alternatively, the transition layer 18 may be formed by twist-wafer-bonding, such as described in Ejeckam et al., "Lattice engineered compliant substrate for defect-free heteroepitaxial growth," Appl. Phys. Lett. 70(13), pp. 1685–1687, Mar. 13, 1997. The transition layer 18 can also be formed by conventional wafer bonding of a thin semiconductor layer to the active substrate 11, which is then used for growth of the semiconductor layers of the upper subcells. Additionally, the transition layer 18 may be absent by using conventional wafer bonding of the semiconductor layers of the upper subcells, which have already been grown on a separate substrate, to the active substrate. In this latter case, the separate substrate, such as Ge or GaAs, on which the semiconductor layers of the upper subcells are grown, may: 1) be absent when bonding to the active Si or SiGe substrate; 2) be present during bonding, and removed after bonding, leaving the semiconductor layers or the upper subcells bonded to the active Si or SiGe substrate; 3) be present during bonding and left on as part of the final cell structure; or 4) have been transferred to another supporting substrate before bonding, with the supporting substrate being present during bonding and then removed afterward.

The transition layer 18, the second upper buffer layer 12, and the first upper buffer layer 13 may vary in composition, thickness and doping. These layers may be composed of multiple sublayers, as in a strained-layer superlattice or in a layer with step-graded composition, in order to transition from one lattice constant to another. Preferably, these layers will be highly transparent to light that can photogenerate electron-hole pairs in the active substrate 11, and that is transmitted through the upper subcells 14–17, in order for the substrate 11 to generate as much current as possible. If the transition layer 18, upper buffer layer 13, or upper buffer layer 12 are composed of semiconductor materials, then preferably the light absorption in these layers is kept low by one or more of the following: (1) forming these layers from semiconductors that have bandgaps above or equal to that of the $n^{th}$ upper subcell 14; (2) forming these layers from semiconductors with an indirect bandgap or with low absorption coefficient in general; (3) making these layers thin to reduce their absorption even for high absorption coefficients.

For example, with a Si substrate 11, the upper buffer layer 12 can be formed from GaP which has a high, indirect bandgap of ~2.26 eV and has only ~0.37% lattice-mismatch to Si. The transition layer 18 can be a region of step-graded composition of GaPAs formed by sublayers of changing composition from GaP with lattice constant of 5.451 Å to the desired composition of GaPAs. For instance, this composition could be $GaP_{0.07}As_{0.93}$, with lattice constant of 5.638 Å and bandgap of ~1.509 eV. The upper buffer layer 13 can then be composed of the same composition of GaPAs to allow dislocations resulting from the lattice mismatch to the Si substrate to become reduced in concentration before beginning the growth of the upper subcells 14–17.

In another example, a SiGe substrate with the same lattice constant as GaP (5.451 Å) can be used, having a Si mole fraction of ~0.91 and a bandgap of ~1.09 eV. The upper buffer layer 12 can again be formed from GaP, but in this example, the GaP buffer layer 12 is lattice-matched to the $Si_{0.91}Ge_{0.09}$ substrate subcell 11. The transition layer 18 and the upper buffer layer 13 can then be as in the previous example.

In a further example, an active SiGe substrate 11 can be used, for instance with a composition of $Si_{0.17}Ge_{0.83}$, with a lattice constant of 5.619 Å and a bandgap of ~0.92 eV. The buffer layer 12, the transition layer 18, and the buffer layer 13 can be composed, for example, of GaPAs or GaInP in order to transition from the 5.619 Å lattice constant of the substrate 11 to the 5.653 Å lattice constant of a GaAs upper subcell 14—a mismatch of 0.60%. The upper subcell 17 can have a base composed of $Ga_{0.52}In_{0.48}P$ and with the same lattice constant 5.653 Å of GaAs and a bandgap of ~1.89 eV (the bandgap of GaInP can vary over a range of ~0.1 eV at the same composition depending on the degree of disorder on the group-III sublattice). There are no additional upper subcells 15, 16 in this particular example.

| $Ga_{0.52}In_{0.48}P$ | /GaAs | /$Si_{0.17}Ge_{0.83}$ | |
|---|---|---|---|
| 1.89 | /1.424 | /0.92 | eV bandgaps |
| 5.653 | /5.653 | /5.619 | Å lattice constants |

The advantage of this cell 10 over a conventional GaInP/GaAs/Ge cell is that the bottom SiGe substrate 11 in the present example has the potential to produce higher voltage than a Ge subcell by virtue of the wider bandgap of the SiGe subcell 11. There is still ample photon flux in the energy range between the ~0.92 eV bandgap of the SiGe subcell 11 in this example and the 1.424 eV bandgap of the GaAs cell 14 to generate excess photocarriers in the SiGe subcell 11. The SiGe subcell 11 does not limit the current of the series-interconnected subcells in the multijunction cell 10, as long as photocarriers in the SiGe substrate 11 can be collected efficiently at the p-n junction. The $Ga_{0.52}In_{0.48}P$/GaAs/$Si_{0.17}Ge_{0.83}$ 3-junction cell 10 of this example is expected to have an ideal efficiency that is ~9 relative % higher than the ideal efficiency of a conventional $Ga_{0.52}In_{0.48}P$/GaAs/Ge 3-junction cell.

Higher Si mole fractions than the 0.17 Si composition in the above example can also be used in the SiGe substrate 11, resulting in higher bandgap in the substrate 11 and potentially higher voltages, without the current in the SiGe substrate 11 becoming small enough to limit the current through the multijunction cell 10. However, it is also advantageous to keep the lattice constant of the substrate close to that of the upper subcells 14 to 17 in order to minimize the change in lattice constant that must be accommodated by the transition layer 18 and the buffer layers 12, 13. A trade-off exists between these competing influences on multijunction cell efficiency, and the difference in lattice constant at which the multijunction cell efficiency is maximized is a function of how well the transition layer 18 and buffer layers 12, 13 can accommodate the change in lattice constant.

The Si mole fraction of $x \approx 0.17$ in $Si_xGe_{1-x}$ is a significant composition because for lower Si compositions the semiconductor band structure is Ge-like with the conduction band minimum occurring along the <111> axes (corresponding to the indirect L-transition). For higher Si compositions, the band structure is Si-like with the conduction band minimum along the <100> axes (indirect X-transition). For Si compositions above $x \approx 0.17$, the bandgap of $Si_xGe_{1-x}$ increases more slowly with respect to increasing x and to the change in lattice-constant than it does for Si compositions below $x \approx 0.17$.

The transition layer 18, buffer layer 13, and buffer layer 12 should also be doped heavily enough that they provide a highly conductive path for current between the upper subcell 14 and the active substrate 11 to avoid excessive series resistance in the multijunction solar cell 10. The layers 12, 13, 18 may have different doping types if they are doped heavily enough to form a tunnel junction such that the series resistance and any opposing voltage formed by the junction is neligible compared to the voltage of the multijunction cell 10. Alternatively, different doping types can be used if the polarity of the p-n junction formed is such that its voltage supplements that of the multijunction cell 10, and the p-n junction formed does not limit or adds to the efficiency of the multijunction cell 10. Preferably, however, the layers 12, 13, 18 should all have the same doping type, as well as have the same doping type as the emitter of the active substrate 11, in order to avoid the formation of a p-n junction that could produce a voltage opposing that of the subcells 14–17 in the multijunction cell 10.

The upper subcells 14–17 can vary in number from 1 to n where n is an integer. Each subcell 14–17 contains a p-n junction. The polarity of each p-n junction is the same as in each of the other subcells 14–17, including the active substrate 11. The polarity of the p-n junctions may either all be of the n-on-p polarity or all of the p-on-n polarity. In general, each of the upper subcells 14–17 is current matched to each other and to the substrate 11 by virtue of their chosen compositions, bandgaps, and thicknesses. The upper subcells 14–17 are typically characterized by an energy bandgap that is greater than that of the active substrate 11. Within the group of the upper subcells 14–17, the bandgap preferably increases from the subcell 14 to the subcell 17 (i.e., from the bottommost to the topmost subcell). In some cases, however, the bandgaps of two adjacent subcells may be equal as long as the photogenerated current density in each subcell is kept the same to achieve current matching.

The particular bandgaps for the upper subcells 14–17 can vary. For example, if the multijunction cell 10 consists of the active substrate 11 and two additional upper subcells (i.e., where n equals two), and the total number of subcells including the active substrate 11 equals three, then the substrate 11 may be Si with a bandgap of 1.12 eV, the upper subcell 14 above the transition layer 18 may be GaPAs, and the topmost upper subcell 17 may be GaInP. The plurality of subcells (for instance, subcells 15, 16) that could in general be positioned between subcells 14 and 17 are absent in this example. If a lattice constant of 5.638 Å is chosen for the top two subcells 14, 17, then the composition of the GaPAs is $GaP_{0.07}As_{0.93}$ such that its bandgap is 1.509 eV, and the composition of the GaInP is $Ga_{0.55}In_{0.45}P$ such that its bandgap is approximately 1.944 eV.

| $Ga_{0.55}In_{0.45}P$ | /$GaP_{0.07}As_{0.93}$ | /Si | |
|---|---|---|---|
| 1.944 | /1.509 | /1/12 | eV bandgaps |
| 5.638 | /5.638 | /5.431 | Å lattice constants |

(As noted previously, the bandgap of the GaInP can vary over a range of about 0.1 eV depending on the degree of ordering of the Ga and In on the group-III sublattice). For these bandgaps, the subcells 14, 17 can be current matched by making the top subcell 17 partially transparent to photons with higher energy than the GaInP bandgap energy by reducing the thickness of the top subcell 17, while leaving the GaPAs subcell 14 thick such that it absorbs almost all photons above the GaPAs bandgap in energy. In this current-matched configuration, the calculated photogenerated current density for the AM0 spectrum can be about 17.52 mA/cm² in the Si substrate 11, the GaPAs subcell 14, and the GaInP top subcell 17. The $Ga_{0.55}In_{0.45}P$/$GaP_{0.07}As_{0.93}$/Si 3-junction cell of this example is expected to have an ideal efficiency that is ~12 relative % higher than the ideal efficiency of a conventional $Ga_{0.52}In_{0.48}P$/GaAs/Ge 3-junction cell.

In another example, the substrate 11 may be Si with a bandgap of 1.12 eV, the upper subcell 14 may be GaAs, and the topmost upper subcell 17 may be GaInP lattice-matched to the GaAs lattice constant:.

| $Ga_{0.52}In_{0.48}P$ | /GaAs | /Si | |
|---|---|---|---|
| 1.89 | /1.424 | /1.12 | eV bandgaps |
| 5.653 | /5.653 | /5.431 | Å lattice constants |

The GaInP/GaAs subcells may either be grown on a transition layer 18 on the active Si substrate, or bonded to the active Si substrate with no transition layer. In this multifunction cell, the GaAs subcell may be thinned significantly in order to transmit some light above the GaAs bandgap energy to the Si substrate, to achieve current matching of all subcells. Although the transmission of some light which could be used by the GaAs subcell to the lower-voltage Si subcell decreases the efficiency somewhat, the reduced thickness of the GaAs subcell is likely to increase radiation resistance of the GaAs subcell, important for space applications. The previous example solves this problem of current matching by shifting the bandgaps of both of the top two subcells higher, thus transmitting more light to the Si subcell, and preventing the Si subcell from current limiting the top two subcells.

In another example, current matching may be achieved with the top two subcells grown at the GaAs lattice constant, which may facilitate the growth of these subcells, by using a Si substrate 11 with a bandgap of 1.12 eV, a GaInPAs upper subcell 14 with a higher bandgap than GaAs to transmit more light to the Si subcell than would the use of GaAs, and a GaInP topmost upper subcell 17:

| $Ga_{0.52}In_{0.48}P$ | $/Ga_xIn_{1-x}P_yAs_{1-y}$ | /Si | |
|---|---|---|---|
| 1.89 | /1.5 | /1.12 | eV bandgaps |
| 5.653 | /5.653 | /5.431 | Å lattice constants |

The GaInP/GaInPAs subcells may either be grown on a transition layer 18 on the active Si substrate, or bonded to the active Si substrate with no transition layer. The GaInP/GaInPAs subcells may be grown on a Ge or GaAs substrate in reverse order, with the GaInP subcell grown first, followed by the GaInPAs subcell. The GaInP/GaInPAs subcells could then be bonded to the active Si substrate, with the GaInPAs subcell closest to the active Si substrate, and the Ge or GaAs substrate that was used for growth could be etched away or otherwise separated from the GaInP subcell, leaving the GaInP/GaInPAs/Si 3-junction photovoltaic cell structure.

Note that 3 subcells above the active Si or SiGe substrate may be used, for a total of 4 subcells in the multijunction solar cell, in order to current match all 4 subcells more effectively. By dividing the photon flux in the solar spectrum with photon energy greater than the bandgap of Si or SiGe by 3 (or more), with each portion used by the 3 (or more) subcells above the active Si or SiGe substrate, the Si or SiGe substrate can have a lower current density and still be current-matched to the upper subcells. As a specific example, the top 3 subcells may be GaInP/GaInPAs/GaAs, either grown on the transition layer 18 on an active Si substrate, or bonded to the active Si substrate with no transition layer:

| $Ga_{0.52}In_{0.48}P$ | $/Ga_xIn_{1-x}P_yAs_{1-y}$ | /GaAs | /Si | |
|---|---|---|---|---|
| 1.89 | /1.7 | /1.424 | /1.12 | eV bandgaps |
| 5.653 | /5.653 | /5.653 | /5.431 | Å lattice constants |

Note that use of an AlGaInP top cell with bandgap of 2.0 eV or higher instead of the GaInP top cell in this structure, still having the same lattice constant as GaAs, substantially reduces the amount that the top cell needs to be thinned in order to achieve current matching in this multijunction cell. The GaInPAs subcell and the GaAs subcell may also be thinned as necessary to achieve current matching in all 4 subcells. Similar to the fabrication sequence described in the previous example, the GaInP/GaInPAs/GaAs subcells may be grown on a Ge or GaAs substrate in reverse order, with the GaInP subcell grown first, followed by the GaInPAs subcell and then the GaAs subcell. The GaInP/GaInPAs/GaAs subcells could then be bonded to the active Si substrate, with the GaAs subcell closest to the active Si substrate, and the Ge or GaAs substrate that was used for growth could be etched away or otherwise separated from the GaInP subcell, leaving the GaInP/GaInPAs/GaAs/Si 4-junction photovoltaic cell structure. The ideal efficiency is calculated to be ~12 relative % higher than that of a conventional $Ga_{0.52}In_{0.48}P$/GaAs/Ge 3-junction cell using cell modeling based on the variation of the voltage and the absorptance of the solar spectrum for each subcell, as a function of the bandgap of the base material of each subcell.

A similar or different construction for each of the upper subcells 14–17 can be utilized. Therefore, the semiconductor layers making up each of the upper subcells 14–17 can vary. Each subcell 14–17 preferably includes a window layer at the top (the side at which light enters the cell 10) and emitter layer under the window, a base layer under the emitter, and a back-surface field (BSF) layer under the base. The window layer typically has a wider bandgap than the emitter layer. The emitter layer may have the same bandgap and composition as the base (i.e., homojunction cell design) or may have a wider bandgap and/or different composition than the base (i.e., heterojunction cell design). The BSF layer usually has a wider bandgap than the base layer, but may have the same bandgap and semiconductor composition as the base and simply be distinguished from the base by having a higher doping concentration than the base. The subcells 14–17 are usually designated by the composition of the semiconductor forming the base layer. The cells 14–17 may have either an n-on-p or a p-on-n configuration and provide 1 to j number of junctions where j is an integer.

For instance, the GaPAs subcell 14 described in the example above has a GaPAs base layer. The emitter can be made of GaPAs of the same composition as the base, or of GaInPAs, GaInP, AlGaInP, AlInP, AlGaPAs, or AlGaAs. The BSF layer may also be made from these materials. Preferably, however, the emitter is made of GaPAs, GaInP, or GaInPAs because these materials can be lattice-matched to the GaPAs base, can be comparatively easily grown with high electronic quality (high minority-carrier lifetime), and can be fairly easily formed with a window layer on top that is made of semiconductors having the same lattice-constant and wider bandgap. Preferably, the BSF layer is made of GaInP or GaInPAs lattice-matched to the GaPAs base, since these materials have a higher bandgap than the GaPAs base. In the example of a GaPAs-base subcell 11, the window layer can be made of GaInPAs, GaInP, AlGaInP, AlInP, AlGaPAs, or AlGaAs. Preferably, however, the window layer is made of GaInP, AlGaInP, or AlInP for a GaPAs or GaInPAs emitter, and AlGaInP or AlInP for a GaInP emitter.

The bases of the various upper subcells 14–17 in the multijunction cell 10 may have various compositions of semiconductors. The preferred compositions are based on their (1) bandgaps and their resulting ability to produce a multijunction cell 10 with current-matched subcells 14–17, including the Si or SiGe substrate 11; (2) lattice constant to achieve lattice matching among the subcells when possible; and (3) ability to grow the specific semiconductor materials with high electronic quality. Examples of the semiconductor materials that may form the bases of the subcells 14–17 are GaAs, InP, SiGe, GaInAs, GaAsSb, GaPAs, GaPSb, GaInP, AlGaAs, GaInPAs, and GaInPSb.

As with the substrate 11, the particular dopant used in the upper subcells 14–17 can vary according to well-known methods in the art. If, as an example, the upper subcell 14 is made of a p-type GaPAs base and an n-type GaPAs emitter, then the base dopant can be Zn, C, Mg, Be, or other p-type dopants used in III–V semiconductors, but preferably Zn or C. The emitter dopant in this example can be Si, Ge, Sn, Se, Te, or other n-type dopants used in III–V semiconductors, but preferably Si or Te. The dopant concentration can also vary, but will typically be from about $1\times10^{15}$ to $5\times10^{18}$ (and preferably about $1\times10^{16}$ to $5\times10^{17}$) in the p-type base layer. The dopant concentration in the n-type emitter can be from about $1\times10^{17}$ to $5\times10^{20}$ (and preferably about $1\times10^{18}$ to $5\times10^{19}$).

As with the active substrate 11, the thicknesses of the upper subcells 14–17 can vary. Typically, however, with the above thickness of the substrate 11, the overall thickness or each of the upper subcells 14–17 may range from about 0.07 to 100 $\mu$m, although preferably from about 0.3 to 3 $\mu$m. In the example of an n-on-p configuration of the subcells 14–17 in the multijunction solar cell 10, and with the above ranges of the overall subcell thickness, the p-type base thickness may range from about 0.05 to 100 $\mu$m, but preferably from about 0.2 to 3 $\mu$m. With the above p-type base thicknesses, the thickness of the n-type emitter may range from about 0.02 to 5 $\mu$m, but preferably from about 0.05 to 0.3 $\mu$m.

Optional tunnel junctions 19, 20, 21 in the multijunction cell 10 serve to conduct current between the subcells 14–17 in order to electrically connect each of the subcells 14–17, including the active substrate 11 (FIG. 1b). A tunnel junction is placed between each pair of adjacent subcells 14–17, including between the upper subcell 14 and the active substrate 11. The tunnel junction 19 is shown immediately under upper subcell 14 and above buffer layer 13. The tunnel junction 19 may also be placed (1) under buffer layer 13 and above the transition layer 18; (2) under the transition layer 18 and above buffer layer 12; and (3) under buffer layer 12 and above the active substrate 11. Alternatively, a tunnel junction may be incorporated into the sublayers which make up the transition layer 18, buffer layer 13, or buffer layer 12.

The tunnel junctions 19–21 joining the subcells 14–17 in the multijunction cell 10 consist of at least two layers—an n-type layer and a p-type layer—preferably heavily-doped in order to increase the tunneling probability of charge carriers across the p-n junction. Nevertheless, the tunnel junctions 19–21 may include additional layers, for example, as dopant diffusion barriers. The doping concentration must be high enough and/or the band offsets of the semiconductor materials on either side of the tunnel junction must be such that the series resistance and the voltage across the tunnel junctions 19–21 that opposes the polarity of the rest of the multijunction cell 10 are kept to a minimum. Preferably, the bandgaps of the semiconductors in the tunnel junction are higher than or equal to that of the subcell above it. Thereby, light that is transmitted through the subcell above the tunnel junction is not absorbed or is only weakly absorbed in the tunnel junction and is thus available for photogenerating carriers in the subcell beneath the tunnel junction. The layers forming the tunnel junctions 19–21 can also be made very thin, preferably in the range from about 100 to 500 Å for each layer, to reduce light absorption in the tunnel junction layers. Semiconductors having an indirect gap, and a correspondingly low absorption coefficient, can also be used in the tunnel junction layers in order to reduce light absorption in the tunnel junctions 19–21.

Figure 2A:
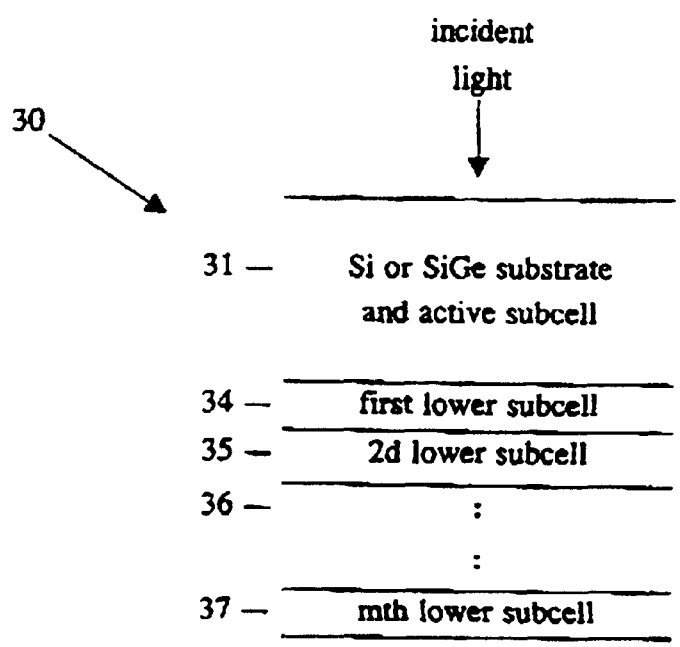
FIG. 2a is a schematic diagram of a monolithic multi-junction photovoltaic cell according to a second embodiment of the present invention.
Figure 2B:
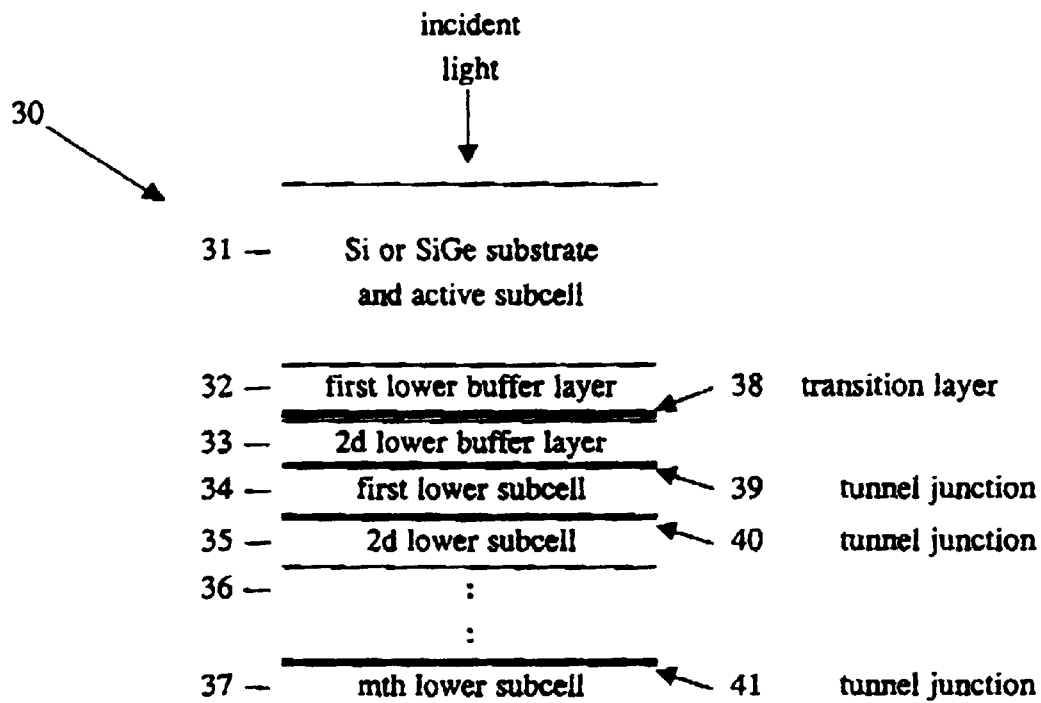
FIG. 2b is a schematic diagram of a monolithic multi-function photovoltaic cell according to a variation of the second embodiment of the present invention

FIG. 2a depicts a second embodiment of the present invention. The embodiment is identical to that shown in FIG. 1a, except that a Si or SiGe active substrate 31 of a photovoltaic cell 30 is at a top position when viewed from FIG. 2. Thus, incident light will be received by the substrate 31 and then a plurality of lower subcells 34–37 that vary in number from 1 to m, where m is an integer. The active side or surface of the substrate 31 is at its upper side or surface. In a variation of the embodiment shown in FIG. 2a, FIG. 2b depicts a transition layer 38 that is intermediate the substrate subcell 31 and the plurality of lower subcells 34–37. Additionally, a first lower buffer layer 32 may be placed intermediate the substrate subcell 31 and the transition layer 38, and a second lower buffer layer 33 may be placed intermediate the transition layer 38 and the lower subcells 34–37. As above in the embodiment of FIG. 1a, either the buffer layer 32, or the buffer layer 33, or both may be absent from the cell 30, equivalent to choosing zero thickness for the layer. The bandgap widths typically decrease as one progresses from the substrate subcell 31 to the lowermost subcell 37. In some cases, however, the bandgaps of two adjacent subcells may be equal as long as the photogenerated current density in each subcell is kept the same to achieve current matching.

The construction and characteristics of the subcells and layers 31–37 are similar to the subcells and layers 11–17 in the first embodiment above, except that semiconductors with lower bandgaps than that of the active substrate 31 are typically used. For example, with a Si substrate 31, the bases of the lower subcells 34–37 can be made of semiconductors with a lower bandgap than the 1.12 eV bandgap of Si, such as SiGe, GaSb, InAs, InSb, GaInAs, GaAsSb, InPAs, GaInSb, GaNAs, GaInNAs, GaNPAs, GaNAsSb, or GaInNP. Because all of the subcells 34–37 have bandgaps below that of the Si or SiGe substrate 31, this second embodiment is most efficiently tuned to spectra with longer average wavelengths than the solar spectrum, for instance, the blackbody radiation of an infrared emitter at 500–2000° C. used in some thermophotovoltaic systems. Likewise, the tunnel junctions 39–41, as well as the transition layer 38, of this second embodiment have constructions and characteristics similar to the tunnel junctions 19–21 and transition layer 18 of the first embodiment.

Figure 3A:
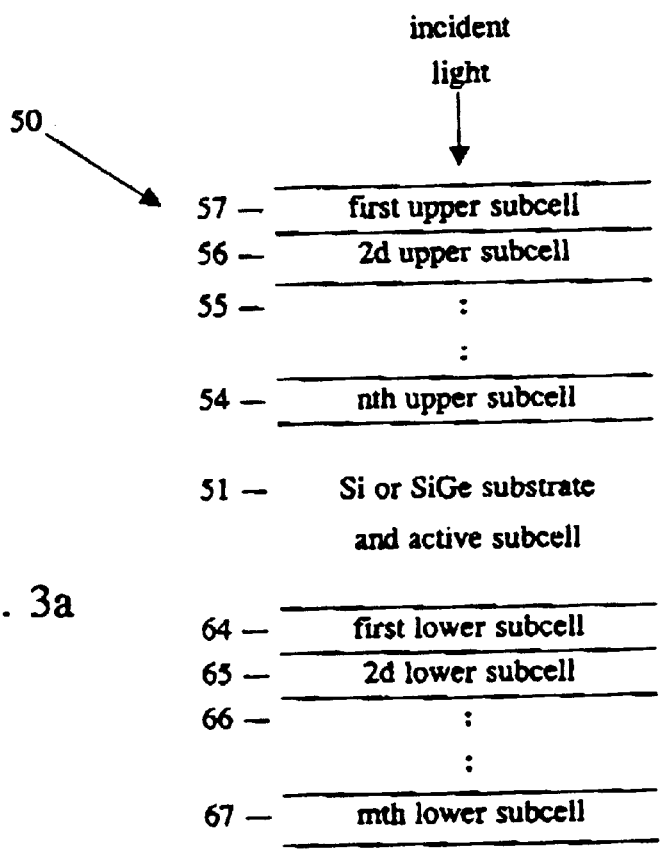
FIG. 3a is a schematic diagram of a monolithic multi-junction photovoltaic cell according to a third embodiment of the present invention.
Figure 3B:
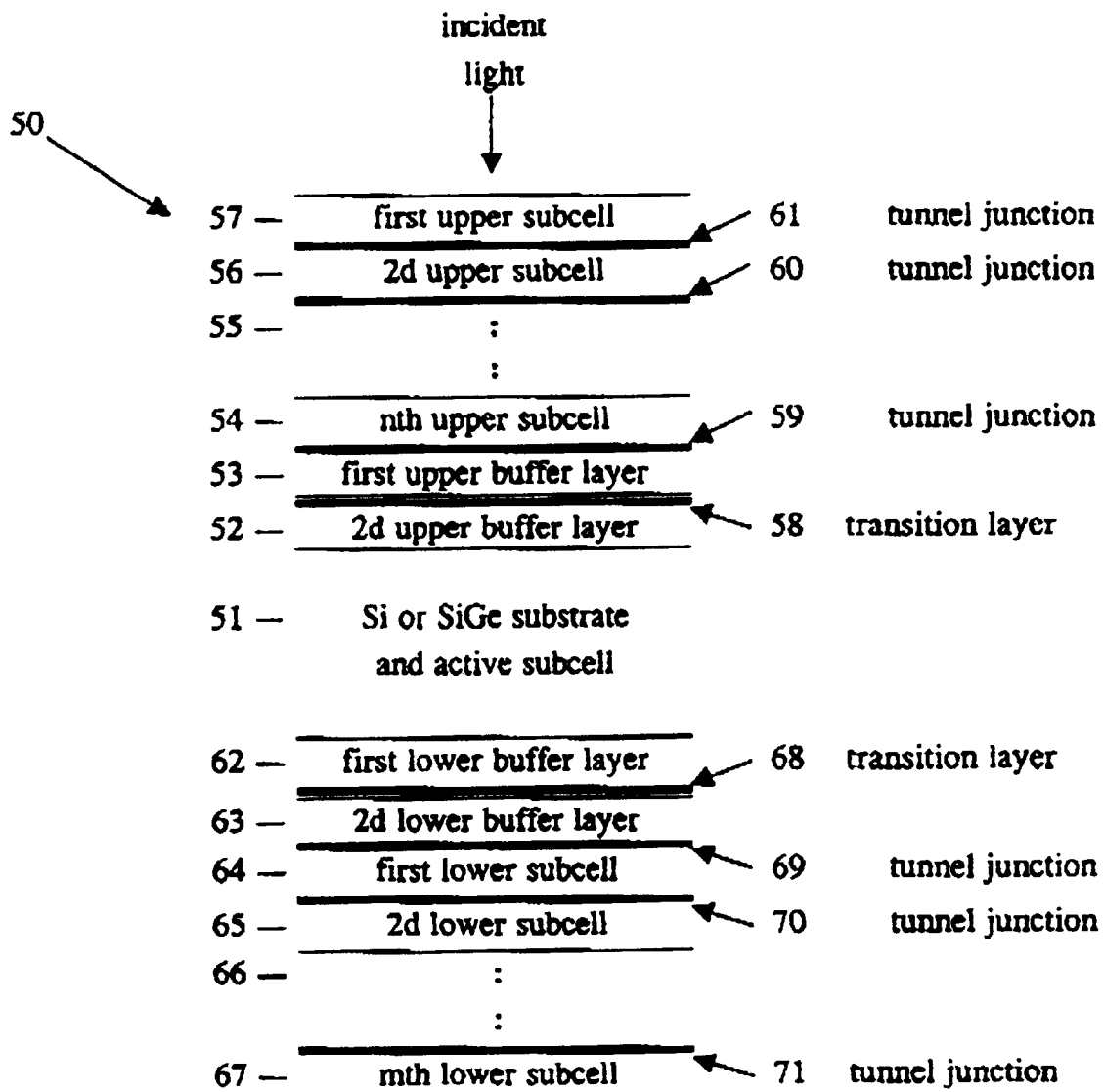
FIG. 3b is a schematic diagram of a monolithic multi-junction photovoltaic cell according to a variation of the third embodiment of the present invention.

FIG. 3a depicts a third embodiment of the present invention. The embodiment is a combination of the embodiments shown in FIG. 1a and FIG. 2a, with a Si or SiGe substrate 51 at an intermediate position within a photovoltaic cell 50 when viewed from FIG. 3a. Thus, the active substrate 51 is placed below a plurality of upper subcells 54–57 that can vary in number from 1 to n and above a plurality of lower subcells 64–67 that can vary in number from 1 to m where n and m are integers. Incident light can then be received by the plurality of upper subcells 54–57. FIG. 3b depicts a variation of the embodiment shown in FIG. 3a and is a combination of the embodiments of FIGS. 1b and 2b.

Accordingly, a transition layer 58 is intermediate the upper subcells 54–57 and an upper active side of the substrate 51. A transition layer 68 is intermediate an lower active side and the lower subcells 64–67. Thus, the bandgap widths typically decrease from the uppermost upper subcell 57 to the substrate subcell 51. From the substrate 51, the bandgap widths typically continue to decrease through the lowermost lower subcell 67. The construction and characteristics of the substrate 51 are similar to those of the substrate 11 in the first embodiment. Likewise the construction and characteristics of the upper subcells 54–57 are similar to those of the upper subcells 14–17 in the first embodiment. The construction and characteristics of the lower subcells 64–67 are similar to those of the lower subcells 34–37 in the second embodiment. The buffer layers 52–53 and 62–63, the tunnel junctions 59–61 and 69–71, and the transition layers 58, 68 of this third embodiment (FIG. 3b) have constructions and characteristics similar to those in the first embodiment.

As specific examples of the third embodiment of the invention, an additional Ge subcell may be grown on or bonded to the back of the active Si or SiGe substrate of previous examples. Light transmitted by the subcells on top of the Si or SiGe substrate, and by the Si or SiGe substrate itself, then generates sufficient current density in the bottom Ge subcell so that the Ge subcell does not current limit the other cells in the multijunction stack. In one example, the top two subcells may be GaInP/GaAs, either grown on a transition layer 18 on top of the active Si substrate, or bonded to the top of the active Si substrate with no transition layer, as discussed previously, but with the additional Ge subcell beneath the Si substrate, resulting in the 4-junction cell structure:

| $Ga_{0.52}In_{0.48}P$ | /GaAs | /Si | /Ge | |
|---|---|---|---|---|
| 1.89 | /1.424 | /1.12 | /0.67 | eV bandgaps |
| 5.653 | /5.653 | /5.431 | /5.658 | Å lattice constants |

In another example, the top two subcells may be GaInP/GaInPAs, either grown on a transition layer 18 on top of the active Si substrate subcell, or bonded to the top of the active Si substrate subcell with no transition layer, as discussed previously, but with the additional Ge subcell beneath the Si substrate, resulting in the 4-junction cell structure:

| $Ga_{0.52}In_{0.48}P$ | $/Ga_xIn_{1-x}P_yAs_{1-y}$ | /Si | /Ge | |
|---|---|---|---|---|
| 1.89 | /1.5 | /1.12 | /0.67 | eV bandgaps |
| 5.653 | /5.653 | /5.431 | /5.658 | Å lattice constants |

In a further example, the top three subcells may be GaInP/GaInPAs/GaAs, either grown on a transition layer 18 on top of the active Si substrate, or bonded to the top of the active Si substrate with no transition layer, as discussed previously, but with the additional Ge subcell beneath the Si substrate, resulting in the 5-junction cell structure:

| $Ga_{0.52}In_{0.48}P$ | $/Ga_xIn_{1-x}P_yAs_{1-y}$ | /GaAs | /Si | /Ge | |
|---|---|---|---|---|---|
| 1.89 | /1.7 | /1.424 | /1.12 | /0.67 | eV bandgaps |
| 5.653 | /5.653 | /5.653 | /5.431 | /5.658 | Å lattice constants |

Modeling indicates that the ideal efficiency of this 5-junction GaInP/GaInPAs/GaAs/Si/Ge cell can be ~17 relative % higher than that of a conventional $Ga_{0.52}In_{0.48}$ P/GaAs/Ge 3-junction cell.

In additional examples of the third embodiment of the invention, an additional GaSb subcell, with bandgap of 0.73 eV, may be grown on or bonded to the back of the active Si or SiGe substrate of previous examples. Similar to the previous examples, light transmitted by the subcells on top of the Si or SiGe substrate, and by the Si or SiGe substrate itself, then generates sufficient current density in the bottom GaSb subcell so that the GaSb subcell does not current limit the other cells in the muitijunction stack. GaInAs or GaAsSb subcells may also serve as the bottom cell beneath the Si or SiGe substrate, and the upper subcells on top of the Si or SiGe substrate. For instance, $Ga_{0.57}In_{0.43}As$ with a bandgap of ~0.86 eV, or $GaAs_{0.60}Sb_{0.40}$ also with a bandgap of ~0.86 eV, are bottom cell compositions that result in approximate current matching with a Si substrate under a set of upper subcells including a GaAs upper subcell. Specific examples with GaSb as the bottom cell include the 4-junction cell:

| $Ga_{0.52}In_{0.48}P$ | /GaAs | /Si | /GaSb | |
|---|---|---|---|---|
| 1.89 | /1.424 | /1.12 | /0.73 | eV bandgaps |
| 5.653 | /5.653 | /5.431 | /6.096 | Å lattice constants; | the 4-junction cell:

| $Ga_{0.52}In_{0.48}P$ | $/Ga_xIn_{1-x}P_yAs_{1-y}$ | /Si | /GaSb | |
|---|---|---|---|---|
| 1.89 | /1.5 | /1.12 | /0.73 | eV bandgaps |
| 5.653 | /5.653 | /5.431 | /6.096 | Å lattice constants; | and the 5-junction cell:

| $Ga_{0.52}In_{0.48}P$ | $/Ga_xIn_{1-x}P_yAs_{1-y}$ | /GaAs | /Si | /GaSb | |
|---|---|---|---|---|---|
| 1.89 | /1.7 | /1.424 | /1.12 | /0.73 | eV bandgaps |
| 5.653 | /5.653 | /5.653 | /5.431 | /6.096 | Å lattice constants |

Note that in a series-interconnected configuration for the multijunction photovoltaic cell, the tunnel junction layers between the Si or SiGe substrate and the bottom cell (e.g., Ge, GaSb, GaInAs, or GaAsSb), that is either grown on or bonded to the bottom surface of the Si or SiGe substrate, may be lattice-matched 1) to the Si or SiGe substrate, 2) to the bottom cell material such as Ge, GaSb, GaInAs, or GaAsSb, or 3) to neither. The tunnel junction should be made of semiconductors with high enough bandgap such that photon energies that are transmitted by the Si or SiGe substrate, and which can be used by the bottom cell, are transmitted through the tunnel junction. Semiconductors which have bandgap $\geq 1.12$ eV, the bandgap of Si, are suitable for this purpose. Some examples of tunnel junction compositions include:

| $p^{++}$-Si/$n^{++}$-Si | lattice-matched to Si |
|---|---|
| $p^{++}$-GaP/$n^{++}$-GaP | approx. lattice-matched to Si |
| $p^{++}$-GaInP/$n^{++}$-GaInP | lattice-matched to Ge |

| | |
|---|---|
| p++-GaAs/n++-GaAs | approx. lattice-matched to Ge |
| p++-AlGaAs/n++-AlGaAs | approx. lattice-matched to Ge |
| p++-AlGaAs/n++-GaInP | approx. lattice-matched to Ge |
| p++-AlGaAs/n++-GaAs | approx. lattice-matched to Ge |

Figure 4:
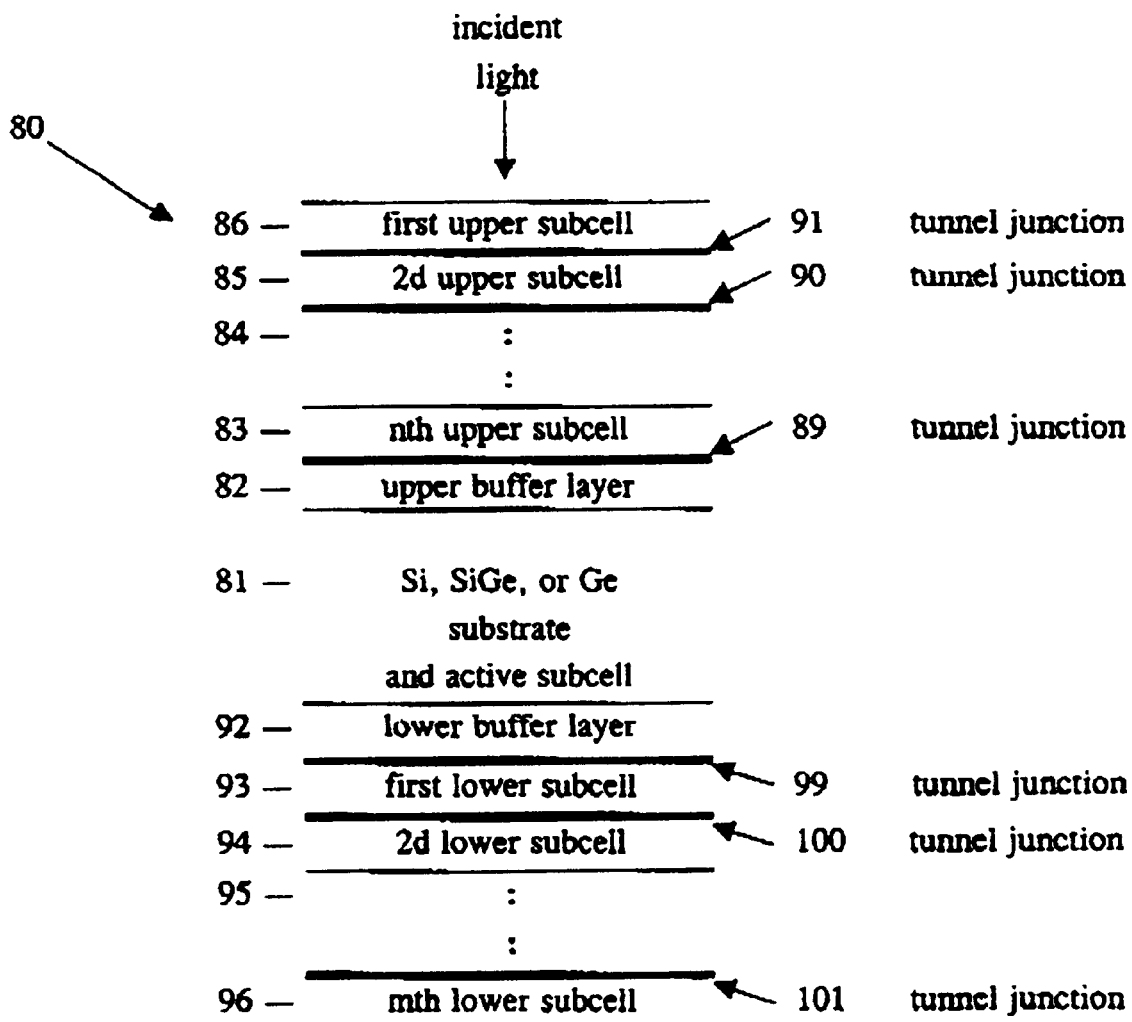
FIG. 4 is a schematic diagram of a monolithic multijunction photovoltaic cell according to a fourth embodiment of the present invention.

FIG. 4 shows a fourth embodiment of the invention that is a variation of the third embodiment (FIG. 3b). In this fourth embodiment, an active Si, SiGe, or Ge substrate 81 of a photovoltaic cell 80 is lattice-matched to a plurality of upper subcells 83–86 above it and to a plurality of lower subcells 93–96 below it. As a result, a transition layer is not needed between either the upper or lower sets of subcells 83–86, 93–96. An upper buffer layer 82 is shown in FIG. 4 between the substrate subcell 81 and the upper subcells 83–86, and a lower buffer layer 92 is shown between the substrate 81 and the lower subcells 93–96. The number of upper subcells 83–86 may range from 0 to n and the number of lower subcells 93–96 may range from 0 to m. The subcells 83–86 and 93–96 have a construction similar to those described in the first embodiment. Also, tunnel junctions 89–101, as well as buffer layers 82, 92, are constructed and function in a fashion similar to those same elements described in the first embodiment.

As a specific example of the fourth embodiment of the invention shown in FIG. 4, an active $Si_{0.08}Ge_{0.92}$ substrate 81 can be used, with a bandgap of ~0.78 eV and with a lattice constant of 5.638 Å, such that the lattice constant of the substrate is matched to the lattice constant $GaP_{0.07}As_{0.93}$, with a bandgap of ~1.509 eV. In this example, the buffer layer 82 can be composed of GaPAs or GaInP of a composition such that the lattice constant is 5.638 Å. The upper subcell 83 can then have a GaPAs base with a bandgap of ~1.509 eV and the upper subcell 86 can have a GaInP base with a bandgap of ~1.944. Both the GaPAs upper subcell 83 and the GaInP upper subcell 86 have the same lattice constant of 5.638 Å, with no additional upper subcells 84, 85, and no lower subcells 93–96 in this particular case.

| $Ga_{0.55}In_{0.45}P$ | /$GaP_{0.07}As_{0.93}$ | /$Si_{0.08}Ge_{0.92}$ | |
|---|---|---|---|
| 1.944 | /1.509 | /0.78 | eV bandgaps |
| 5.638 | /5.638 | /5.638 | Å lattice constants |

In this example, the lattice constant of the SiGe substrate 81 and of the upper subcells 83, 86 are the same so that no transition layer is needed to transition from the lattice constant of the substrate 81 to that of the upper subcells 83, 86. But the buffer layer 82 still serves to change the composition from that of the SiGe substrate 81 to the composition of the GaPAs upper subcell 83.

In another specific example of the fourth embodiment of the invention, an active $Si_{0.17}Ge_{0.83}$ substrate 81 can be used with a bandgap of ~0.92 eV and a lattice constant of 5.619 Å. The upper subcell 83 in this example can be GaPAs of a composition $GaP_{0.17}As_{0.83}$ with a bandgap of ~1.623 eV and the same lattice constant 5.619 Å as that of the SiGe substrate 81. The upper subcell 86 can be GaInP of a composition $Ga_{0.60}In_{0.40}P$ with a bandgap of ~2.015 eV and lattice constant 5.619 Å, lattice-matched to the SiGe substrate 81 and the GaPAs upper subcell 83.

| $Ga_{0.60}In_{0.40}P$ | /$GaP_{0.17}As_{0.83}$ | /$Si_{0.17}Ge_{0.83}$ | |
|---|---|---|---|
| 2.015 | /1.623 | /0.92 | eV bandgaps |
| 5.619 | /5.619 | /5.619 | Å lattice constants |

The additional upper subcells 84, 85 and the lower subcells 93–96 are absent in this example, providing for a total of three subcells in this particular multijunction photovoltaic cell 80.

In another example of the fourth embodiment, an active $Si_{0.17}Ge_{0.83}$ substrate 81 can again be used with a bandgap of ~0.92 eV and with a lattice constant of 5.619 Å. However, in this example, the upper subcell 83 as shown in FIG. 4 is another cell with a base composed of $Si_{0.17}Ge_{0.83}$ that is much thinner than the $Si_{0.17}Ge_{0.83}$ substrate 81 in order for the photogenerated current density that can be collected in the upper subcell 83 to be matched to that collected in the substrate subcell 81. The upper subcell 85 in this example can be GaPAs of a composition $GaP_{0.17}As_{0.83}$ such that it has a bandgap of ~1.623 eV and a lattice constant of 5.619 Å, lattice-matched to the SiGe substrate subcell 81 and the SiGe upper subcell 83. The upper subcell 86 can be GaInP of a composition $Ga_{0.60}In_{0.40}P$ with a bandgap of ~2.015 eV and a lattice constant of 5.619 Å, lattice-matched to the SiGe substrate 81, the SiGe upper subcell 83, and the GaPAs upper subcell 85.

| $Ga_{0.60}In_{0.40}P$ | /$GaP_{0.17}As_{0.83}$ | /$Si_{0.17}Ge_{0.83}$ | /$Si_{0.17}Ge_{0.83}$ | |
|---|---|---|---|---|
| 2.015 | /1.623 | /0.92 | /0.92 | eV bandgaps |
| 5.619 | /5.619 | /5.619 | /5.619 | Å lattice constants. |

The additional upper subcell 84 and the lower subcells 93–96 are absent in this example, providing for a total of four active subcells in this particular case.

Modeling based on the variation of the voltage and the absorptance of the solar spectrum for each subcell, as a function of the bandgap of the base material of each subcell, indicates that the above example of a lattice-matched, $Ga_{0.60}In_{0.40}P/GaP_{0.17}As_{0.83}/Si_{0.17}Ge_{0.83}/Si_{0.17}Ge_{0.83}$, 4-junction cell 80 can have an ideal energy conversion efficiency that is ~12 relative % higher at AMO, 28° C. than the calculated ideal efficiency of a conventional $Ga_{0.52}In_{0.48}P$/GaAs/Ge 3-junction cell. The relative % difference in performance between these two types of multijunction cells becomes even greater as the cell temperature increases to a more typical operating temperature of 70° C.

Modeling calculations for both types of multijunction cells is based on an ideal fill factor for each subcell with unity diode ideality factor, no series resistance losses, unity current collection efficiency for all photogenerated carriers in each subcell, and optically thin subcells where necessary for current matching. These ideal conditions are used in the cell modeling in order to compare the upper limit of performance for various multijunction cell structures. The requirement for current matching results in a $Ga_{0.60}In_{0.40}P$ top subcell 1 and $Si_{0.17}Ge_{0.83}$ subcell 3 in the 4-junction $Ga_{0.60}In_{0.40}P/GaP_{0.17}As_{0.83}/Si_{0.17}Ge_{0.83}/Si_{0.17}Ge_{0.83}$ cell, and a $Ga_{0.52}In_{0.48}P$ top subcell 1 in the conventional 3-junction $Ga_{0.52}In_{0.48}P$/GaAs/Ge cell, which are thin enough to transmit some photons with energy above the semiconductor bandgap of each subcell. In order to compare ideal multijunction cell performance for different technologies, the modeling calculations also take the optical loss at the top of each subcell to be zero. If this optical loss, which could be due to tunnel junction absorption, reflection, etc., is assumed to have a value of 5%, then the ideal energy conversion efficiency of the above example of a lattice-matched, $Ga_{0.60}In_{0.40}P/GaP_{0.17}As_{0.83}/Si_{0.17}Ge_{0.83}/Si_{0.17}Ge_{0.83}$, 4-junction cell 80 is ~10 relative % higher at AM0, 28° C. than the calculated ideal efficiency of a conventional $Ga_{0.52}In_{0.48}P/GaAs/Ge$ 3-junction cell. The use of semi-conductors in each tunnel junction with bandgaps higher than those of the base semiconductor of the subcell immediately above the tunnel junction can reduce the parasitic absorption of light in the tunnel junction, that could otherwise be used for useful current generation, to significantly less than 5% in practice.

For a Si composition wherein x is below ~0.17, resulting in Ge-like band structure in the SiGe subcells of the GaInP/GaPAs/SiGe/SiGe multijunction cell 80, the requirement of equal photogenerated current density collected in both the SiGe substrate 81 and the SiGe upper subcell 83 is made more tractable by the nature of the absorption coefficient. In the band structure of Ge, a direct transition exists at about 0.8 eV, only slightly above the 0.67-eV indirect transition. For compositions of SiGe with low Si mole fraction x, such that this feature of a direct energy gap $E_{g,d}$ is slightly higher in energy than the indirect energy gap $E_{g,i}$, this aspect of the band structure can be used to help balance the current in the two SiGe subcells with the same bandgap. Photons with energy greater than $E_{g,d}$ are absorbed very strongly by this direct transition, generating an electron-hole pair, and many of these photons could be absorbed by the optically-thin SiGe upper subcell 83. Photons between $E_{g,i}$ and $E_{g,d}$ in energy are much more weakly absorbed, since they must be absorbed by an indirect transition, but they can still be absorbed by a cell with a very thick base, such as the SiGe substrate subcell 81, along with some of the photons with energy $>E_{g,d}$ that are transmitted through the optically-thin SiGe upper subcell 83, in order to achieve current matching.

The following particular cases of 4-junction cells are also specific examples of the fourth embodiment of the invention:

| 1. | $Ga_{0.52}In_{0.48}P$ | /GaAs | /$Si_{0.02}Ge_{0.98}$ | /$Si_{0.02}Ge_{0.98}$ | |
|---|---|---|---|---|---|
| | 1.89 | /1.424 | /0.69 | /0.69 | eV bandgaps |
| | 5.653 | /5.653 | /5.653 | /5.653 | Å lattice constants |

Ideal efficiency is ~9 relative % higher than that of a conventional $Ga_{0.52}In_{0.48}P/GaAs/Ge$ 3-junction cell according to above modeling.

| 2. | $Ga_{0.52}In_{0.48}P$ | /GaAs | /Ge | /$Si_{0.02}Ge_{0.98}$ | |
|---|---|---|---|---|---|
| | 1.89 | /1.424 | /0.67 | /0.69 | eV bandgaps |
| | 5.653 | /5.653 | /5.653 | /5.653 | Å lattice constants |

Ideal efficiency is ~8.5 relative % higher than that of a conventional $Ga_{0.52}In_{0.48}P/GaAs/Ge$ 3-junction cell according to above modeling.

| 3. | $Ga_{0.52}In_{0.48}P$ | /GaAs | /$Si_{0.02}Ge_{0.98}$ | /Ge | |
|---|---|---|---|---|---|
| | 1.89 | /1.424 | /0.69 | /0.67 | eV bandgaps |
| | 5.653 | /5.653 | /5.653 | /5.658 | Å lattice constants |

Ideal efficiency is ~8.5 relative % higher than that of a conventional $Ga_{0.52}In_{0.48}P/GaAs/Ge$ 3-junction cell according to above modeling.

| 4. | $Ga_{0.52}In_{0.48}P$ | /GaAs | /Ge | /Ge | |
|---|---|---|---|---|---|
| | 1.89 | /1.424 | /0.67 | /0.67 | eV bandgaps |
| | 5.653 | /5.653 | /5.658 | /5.658 | Å lattice constants |

Ideal efficiency is ~8 relative % higher than that of a conventional $Ga_{0.52}In_{0.48}P/GaAs/Ge$ 3-junction cell according to above modeling.

Figure 5A:
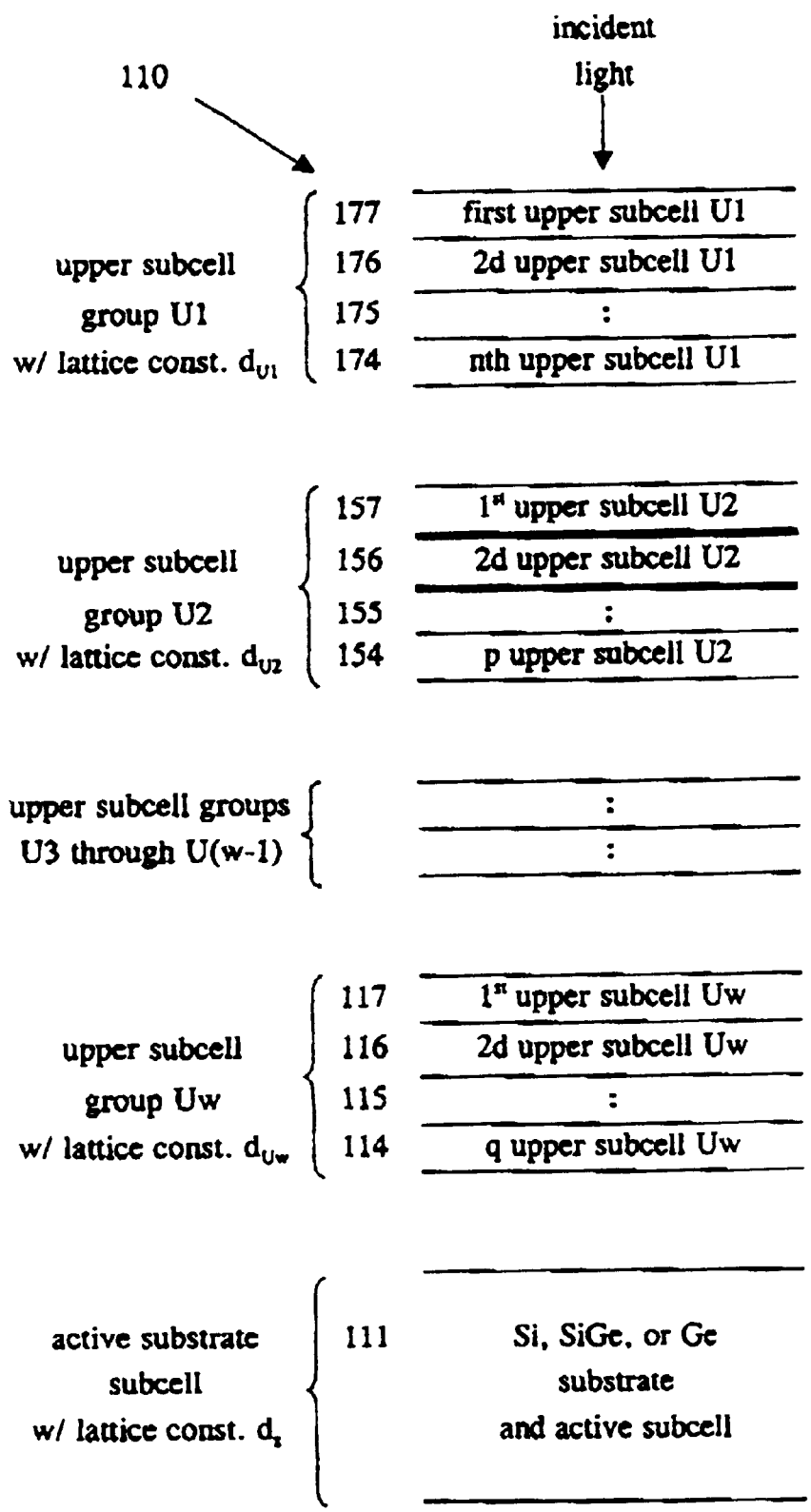
FIG. 5a is a schematic diagram of a monolithic multijunction photovoltaic cell according to a fifth embodiment of the present invention.
Figure 5B:
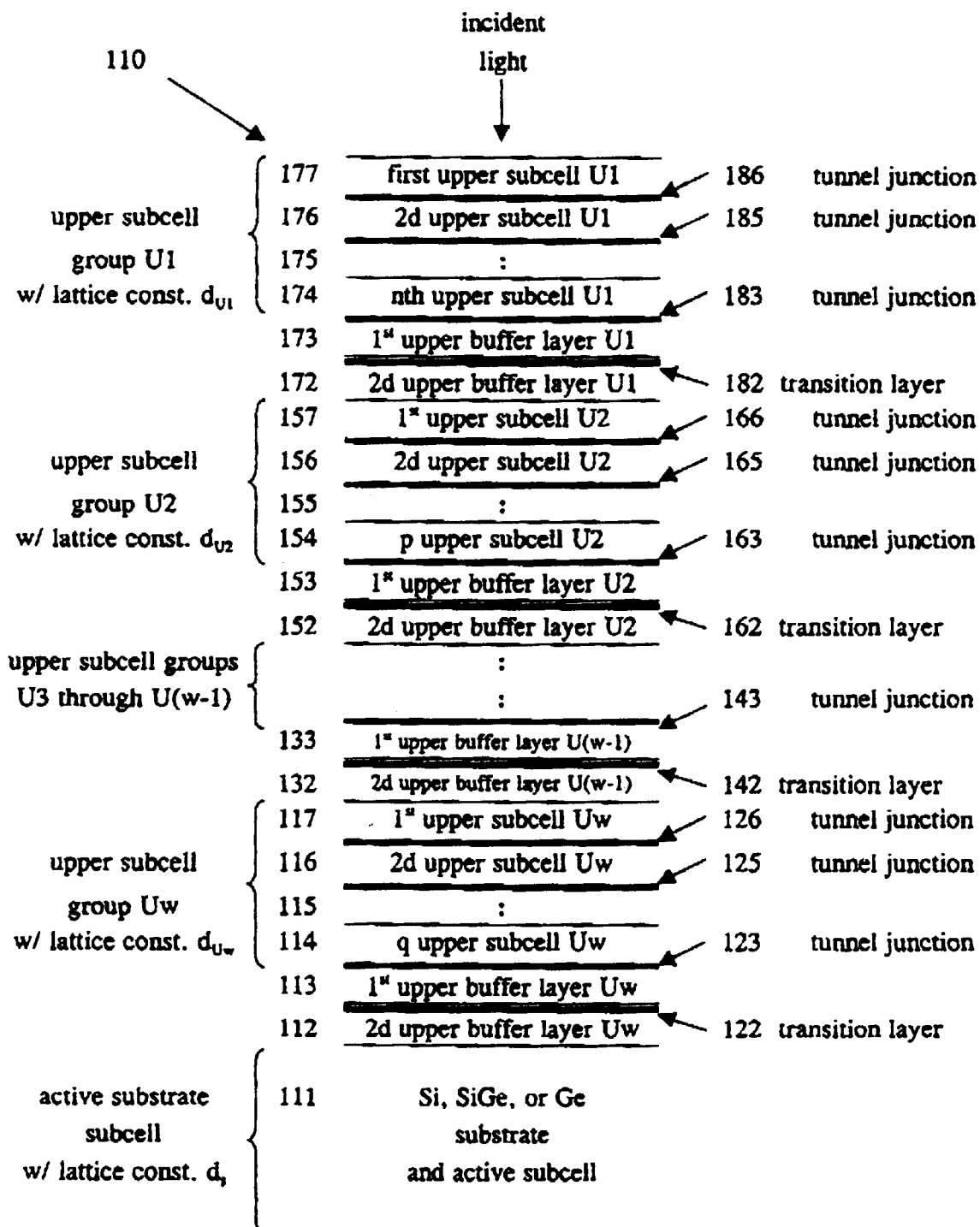
FIG. 5b is a schematic diagram of a monolithic multifunction photovoltaic cell according to a variation of the fifth embodiment of the present invention.

FIG. 5a shows a fifth embodiment of the invention that includes an active Si, SiGe, or Ge substrate 111 in a photovoltaic cell 110. This embodiment is characterized by a substrate bandgap that is lower than or equal to that of a pure silicon substrate and a substrate lattice constant $d_s$ that is larger than or equal to that of pure silicon. Also included are two or more groups U1–Uw of upper subcells 114–117, 154–157, 174–177, where w is an integer greater than or equal to 2. Each group of upper subcells U1–Uw is characterized by a lattice constant $d_{U1}, d_{U2}, \ldots, d_{Uw}$ and may consist of one or more upper subcells. Each group of upper subcells U1–Uw is separated from the adjacent group by a transition layer 142, 162, 182 and optionally by additional buffer layers 132–133, 152–153, 172–173 (FIG. 5b) to accommodate the difference between the lattice constant $d_{Ui}$ of a group Ui of upper subcells (wherein "i" is an integer of at least 1) and the lattice constant $d_{U(i-1)}$ of the group U(i-1) of upper subcells above the transition layer. The lowermost group of upper subcells Uw is separated from the active substrate 111 by a transition layer 122 and optionally by additional buffer layers 112–113 to accommodate the difference between the lattice constant $d_s$ of the active substrate 111 and the lattice constant $d_{Uw}$ of the lowermost group of upper subcells 114–117.

In a particular example of this fifth embodiment, the substrate can consist of an SiGe active substrate 111, an upper subcell group Uw consisting of one subcell of GaInAs with a lattice constant greater than that of the SiGe substrate and with a bandgap chosen to current match the GaInAs subcell to the other subcells in the multifunction cell 111, and an upper subcell group U1 consisting of a GaPAs subcell and a GaInP subcell, both with the same lattice constant as each other and as the SiGe substrate. The total number w of upper subcell groups in this example is 2. This example, with particular compositions provided, is the first one listed in a series of examples below based on the modeling described above:

| | | | | | |
|---|---|---|---|---|---|
| 1. | $Ga_{0.60}In_{0.40}P$ | $/GaP_{0.17}As_{0.83}$ | $/Ga_{0.83}IN_{0.17}As$ | $/Si_{0.17}Ge_{0.83}$ | |
| | 2.015 | /1.623 | /1.24 | /0.92 | eV bandgaps |
| | 5.619 | /5.619 | /5.723 | /5.619 | Å lattice constants |
| 2. | $Ga_{0.60}In_{0.40}P$ | $/GaP_{0.17}As_{0.83}$ | $/Ga_{0.83}IN_{0.17}As$ | $/Si_{0.17}Ge_{0.83}$ | |
| | 2.015 | /1.623 | /1.24 | /0.92 | eV bandgaps |
| | 5.619 | /5.619 | /5.699 | /5.619 | Å lattice constants |
| 3. | $Ga_{0.60}In_{0.40}P$ | $/GaP_{0.17}As_{0.83}$ | $/Ga_{0.83}IN_{0.17}As$ | $/Si_{0.17}Ge_{0.83}$ | |
| | 2.015 | /1.623 | /1.424 | /0.92 | eV bandgaps |
| | 5.619 | /5.619 | /5.653 | /5.619 | Å lattice constants |
| 4. | $Ga_{0.60}In_{0.40}P$ | $/GaP_{0.17}As_{0.83}$ | $/Ga_{0.66}In_{0.32}As$ | /Ge | |
| | 2.015 | /1.623 | /1.08 | /0.67 | eV bandgaps |
| | 5.619 | /5.619 | /5.784 | /5.658 | Å0 lattice constants |
| 5. | $Ga_{0.60}In_{0.40}P$ | $/GaP_{0.17}As_{0.83}$ | $/GaAs_{0.79}Sb_{0.21}$ | /Ge | |
| | 2.015 | /1.623 | /1.08 | /0.67 | eV bandgaps |
| | 5.619 | /5.619 | /5.746 | /5.658 | Å lattice constants |
| 6. | $Ga_{0.60}In_{0.40}P$ | $/GaP_{0.17}As_{0.83}$ | $/Si_{0.17}Ge_{0.83}$ | /Ge | |
| | 2.015 | /1.623 | /0.92 | /0.67 | eV bandgaps |
| | 5.619 | /5.619 | /5.619 | /5.658 | Å lattice constants |
| 7. | $Ga_{0.52}In_{0.48}P$ | /GaAs | $/Ga_{0.61}In_{0.39}As$ | /Ge | |
| | 1.89 | /1.424 | /1.01 | /0.67 | eV bandgaps |
| | 5.653 | /5.653 | /5.811 | /5.658 | Å lattice constants |
| 8. | $Ga_{0.52}In_{0.48}P$ | /GaAs | $/GaAs_{0.74}Sb_{0.26}$ | /Ge | |
| | 1.89 | /1.424 | /1.01 | /0.67 | eV bandgaps |
| | 5.653 | /5.653 | /5.769 | /5.658 | Å lattice constants |
| 9. | $Ga_{0.52}In_{0.48}P$ | /GaAs | $/Si_{0.17}Ge_{0.83}$ | /Ge | |
| | 1.89 | /1.424 | /0.92 | /0.67 | eV bandgaps |
| | 5.653 | /5.653 | /5.619 | /5.658 | Å lattice constants |

For this fifth embodiment, If the layers in the subcell(s) that have a different lattice constant than the substrate are thin enough compared to their lattice mismatch with the substrate for them to be strained layers free from dislocations, and yet are thick enough to have ample photogenerated current density for current matching to the other subcells in the multijunction cell 110, then the transition layers 122, 142, 162, 182 may be absent (FIG. 5a).

In another class of examples of the fifth embodiment of the invention, a compressive strain in one group of upper subcells U1–Uw with respect to the substrate may be partially compensated by tensile strain in an adjacent group of upper subcells U1–Uw. A particular example includes a SiGe active substrate 111, an upper subcell group Uw consisting of one subcell of GaInAs with a lattice constant greater than that of the SiGe substrate and with a bandgap chosen to current match the GaInAs subcell to the other subcells in the multijunction cell 110; an upper subcell group U2 consisting of one GaPAs subcell with lattice constant less than that of the SiGe substrate and with a bandgap chosen to current match the GaPAs subcell to the other subcells in the multijunction cell 110; and an upper subcell group U1 consisting of one GaInP subcell with the same lattice constant as the SiGe substrate. The tensile strain of the GaPAs subcell thus acts to partially compensate the compressive strain of the GaInAs subcell with respect to the lattice constant of the SiGe substrate 111 and the GaInP top subcell, resulting in a sequence of layers in the multijunction cell 110 that is strain-balanced as a whole. This is the first example shown in the table of this strain-compensated class of the fifth embodiment of the invention listed below wherein the above modeling was utilized:

| | | | | | |
|---|---|---|---|---|---|
| 10. | $Ga_{0.60}In_{0.45}P$ | $/GaP_{0.17}As_{0.83}$ | $/Ga_{0.73}In_{0.27}As$ | $/Si_{0.08}Ge_{0.92}$ | |
| | 1.944 | /1.623 | /1.14 | /0.78 | eV bandgaps |
| | 5.638 | /5.619 | /5.761 | /5.638 | Å lattice constants |
| 11. | $Ga_{0.55}In_{0.45}P$ | $/GaP_{0.17}As_{0.83}$ | $/GaAs_{0.83}Sb_{0.17}$ | $/Si_{0.08}Ge_{0.92}$ | |
| | 1.944 | /1.623 | /1.14 | /0.78 | eV bandgaps |
| | 5.638 | /5.619 | /5.727 | /5.638 | Å lattice constants |
| 12. | $Ga_{0.55}In_{0.45}P$ | $/GaP_{0.17}As_{0.83}$ | /GaAs | $/Si_{0.08}Ge_{0.92}$ | |
| | 1.944 | /1.623 | /1.424 | /0.78 | eV bandgaps |
| | 5.638 | /5.619 | /5.653 | /5.638 | Å lattice constants |
| 13. | $Ga_{0.55}In_{0.45}P$ | /GaInPAs | $/Si_{0.17}Ge_{0.83}$ | $/Si_{0.08}Ge_{0.92}$ | |
| | 1.944 | /1.41–1.88 | /0.92 | /0.78 | eV bandgaps |
| | 5.638 | /5.657 | /5.619 | /5.638 | Å lattice constants |
| 14. | $Ga_{0.52}In_{0.48}P$ | $/GaP_{0.17}As_{0.83}$ | $/Ga_{0.89}In_{0.11}As$ | /Ge | |
| | 1.89 | /1.623 | /1.309 | /0.67 | eV bandgaps |
| | 5.653 | /5.619 | /5.697 | 15.658 | Å lattice constants |
| 15. | $Ga_{0.52}In_{0.48}P$ | $/GaP_{0.17}As_{0.83}$ | $/GaAs_{0.90}Sb_{0.10}$ | /Ge | |
| | 1.89 | /1.623 | /1.25 | /0.67 | eV bandgaps |
| | 5.653 | /5.619 | /5.697 | /5.658 | Å lattice constants |
| 16. | $Ga_{0.52}In_{0.48}P$ | /GaInPAs | $/Si_{0.17}Ge_{0.83}$ | /Ge | |
| | 1.89 | /1.34–1.78 | /0.92 | /0.67 | eV bandgaps |
| | 5.653 | /5.687 | /5.619 | /5.658 | Å lattice constants |

As before, if the layers in the subcell(s) that have a different lattice constant than the substrate are thin enough compared to their lattice mismatch with the substrate for them to be strained layers free from dislocations, and yet are thick enough to have ample photogenerated current density for current matching to the other subcells in the multijunction cell 110, then the transition layers 122, 142, 162, 182 may be absent.

This combination of two or more groups of upper subcells with different lattice constants, and two or more lattice-constant-transitioning layers, can also be combined with the lower subcell configurations described in the previous embodiments.

A sixth embodiment (not diagrammed in the drawings) is analogous to the fifth embodiment, but consists of two or more groups of lower subcells (with different characteristic lattice constants in each group) that are positioned beneath the active substrate subcell. This embodiment of the multijunction photovoltaic cell of the present invention includes: (a) an active Si, SiGe, or Ge substrate characterized by a substrate bandgap that is lower than or equal to that of a pure silicon substrate and a substrate lattice constant $d_s$ that is larger than or equal to that of pure silicon; and (b) two or more groups of lower subcells labelled L1 through Lv where v is an integer greater than or equal to 2. Each group of lower subcells L1, L2, . . . , Lv is characterized by a lattice constant $d_{L1}$, $d_{L2}$, . . . , $d_{Lv}$ and may consist of one or more lower subcells. Each group of lower subcells is separated from the adjacent group by a transition layer and optionally by additional buffer layers to accommodate the difference between the lattice constant $d_{Lj}$ of a group Lj of lower subcells and the lattice constant $d_{L(j-1)}$ of the group L(j−1) of lower subcells above the transition layer. The uppermost group of lower subcells L1 is separated from the active substrate subcell by a transition layer and optionally by additional buffer layers to accommodate the difference between the lattice constant $d_s$ of the active substrate subcell and the lattice constant $d_{L1}$ of the uppermost group of lower subcells.

This combination of two or more groups of lower subcells with different lattice constants, and two or more lattice-constant-transitioning layers, can also be combined with the upper subcell configurations described in the previous embodiments.

As can be appreciated by those skilled in the art, the present invention provides an improved monolithic multi-function photovoltaic cell that can utilize a Si or SiGe substrate as an active subcell—whether at the top, bottom, or intermediate positions within the entirety of the multijunction cell. Further provided by the present invention is a photovoltaic cell that has increased efficiency and adaptability to different applications and incident light spectra. Higher efficiency photovoltaic conversion is extremely leveraging since for an application with a given power requirement, fewer cells are required, reducing the cost of the cells and supporting structures in the photovoltaic array. Higher efficiency energy conversion also results in less waste heat, lowering the array temperature and further improving power output. These advantages are important for space applications, as in satellite power arrays, as well as for terrestrial concentrating and non-concentrating photovoltaic systems, and for thermophotovoltaics. For space, the reduced cell area and support structures required for a given power also result in the very significant advantages of reduced stowage volume, reduced extent of the array as deployed, and reduced weight of the array which reduces the cost of satellite launch. By virtue of the greater strength and lower density of Si substrates as opposed to Ge substrates, the multijunction cells described in the foregoing that have Si substrates can be made lighter, thinner, and with higher mechanical yield that for those made on conventional Ge substrates. To the extent that SiGe substrates also have greater strength and lower density than Ge substrates, multijunction cells with SiGe substrates can also be made lighter and thinner, with higher mechanical yield.

It should be understood, of course, that the foregoing relates to preferred embodiments of the invention and that modifications may be made without departing from the spirit and scope of the invention as set forth in the following claims.

What is claimed is:

1. A photovoltaic cell, comprising:
   an active substrate comprising one of Si and SiGe, said substrate having an upper side and a lower side opposite said upper side and being characterized by a substrate bandgap and a substrate lattice constant; and
   at least one subcell disposed adjacent one of said upper side and lower side of said substrate, said subcell being characterized by a one subcell lattice constant and current matched to said active substrate.

2. The photovoltaic cell of claim 1, wherein said at least one subcell is in contact with said one of said upper side and lower side of said active substrate, and said one subcell lattice constant is substantially the same as said substrate lattice constant.

3. The photovoltaic cell of claim 1, wherein said at least one subcell is not in contact with said one of said upper side and lower side of said active substrate, and said one subcell lattice constant is not substantially the same as said substrate lattice constant.

4. The photovoltaic cell of claim 3, further comprising:
   a transition layer between said one of said upper side and lower side of said active substrate and said at least one subcell.

5. The photovoltaic cell of claim 4, further comprising:
   a buffer layer between said transition layer and said active substrate.

6. The photovoltaic cell of claim 5, further comprising:
   another buffer layer between said transition layer and said at least one subcell.

7. The photovoltaic cell of claim 1, wherein a subcell bandgap of said at l east one subcell is at least equal to said substrate bandgap.

8. The photovoltaic cell of claim 1, wherein a subcell bandgap of said at least one subcell is not greater than said substrate bandgap.

9. The photovoltaic cell of claim 1, further comprising:
   at least another subcell in contact with said other one of said upper side and said lower side, said another subcell being characterized by a another subcell lattice constant that is substantially the same as said substrate lattice constant.

10. The photovoltaic cell of claim 1, further comprising:
    at least another subcell adjacent to and not in contact with said other one of said upper side and said lower side, said another subcell being characterized by another subcell lattice constant that is not substantially the same as said substrate lattice constant.

11. The photovoltaic cell of claim 10, further comprising:
    a transition layer between said other one of said upper side and lower side of said active substrate and said at least another subcell.

12. The photovoltaic cell of claim 11, further comprising:
    a buffer layer between said transition layer and said active substrate.

13. The photovoltaic cell of claim 12, further comprising:
   another buffer layer between said transition layer and said at least another subcell.

14. The photovoltaic cell of claim 1, wherein said at least one subcell comprises one plurality of groups of subcells characterized by a plurality of group lattice constants that are different from said substrate lattice constant,
   said photovoltaic cell further comprising one plurality of transition layers, one transition layer between said active substrate and the closest one of said groups of subcells to said active substrate and respective other transition layers between adjacent ones of said groups of subcells.

15. The photovoltaic cell of claim 14, wherein said groups of subcells are current matched with each other and with said active substrate.

16. The photovoltaic cell of claim 14, wherein said upper side of said active substrate is active, and each one of said groups of subcells are disposed above said active substrate, and a lowermost subcell of the lowermost of said groups of subcells has a base with a bandgap at least equal to said substrate bandgap, and each of the other subcells of said groups of subcells has a base with a bandgap at least equal to that of the subcell immediately beneath it.

17. The photovoltaic cell of claim 16, further comprising:
   a first upper buffer layer above each one of said transition layers.

18. The photovoltaic cell of claim 17, further comprising:
   a second upper buffer layer below each one of said transition layers.

19. The photovoltaic cell of claim 16, further comprising at least another plurality of groups of subcells disposed below said active substrate, wherein the uppermost subcell of said another plurality of groups of subcells has a base with a bandgap that is not greater than said substrate bandgap, and each successively lower one of said another plurality of groups of subcells has a base with a bandgap that is not greater than the bandgap of the subcell immediately above it.

20. The photovoltaic cell of claim 19, further comprising:
   another plurality of transition layers disposed between adjacent groups in said another plurality of groups of subcells; and
   a first lower buffer layer above each one of said transition layers within said another plurality of groups of subcells.

21. The photovoltaic cell of claim 20, further comprising:
   a second lower buffer layer below each one of said transition layers within said another plurality of groups of subcells.

22. The photovoltaic cell of claim 14, wherein said lower side of said active substrate is active, and each one of said groups of subcells are disposed below said active substrate, and the uppermost subcell of said group of subcells has a base with a bandgap that is not greater than said substrate bandgap, and each successively lower one of said subcells has a base with a bandgap that is not greater than the bandgap of the subcell immediately above it.

23. The photovoltaic cell of claim 22, further comprising:
   a first lower buffer layer above each one of said transition layers.

24. The photovoltaic cell of claim 23, further comprising:
   a second lower buffer layer below each one of said transition layers.

25. The photovoltaic cell of claim 22, further comprising at least another plurality of groups of subcells disposed above said active substrate, wherein the lowermost subcell of said another plurality of groups of subcells has a base with a bandgap that is at least equal to said substrate bandgap, and each of the other subcells of said another plurality of groups of subcells has a base with a bandgap that is at least equal to that of the subcell immediately beneath it.

26. A multijunction photovoltaic cell, comprising:
   an active substrate comprising one of Si and SiGe, said substrate having an upper side and a lower side opposite said upper side, with said substrate being characterized by a substrate bandgap and a substrate lattice constant;
   at least one upper subcell disposed adjacent to said upper side, said upper subcell being current matched to said active substrate and characterized by an upper subcell lattice constant and an upper subcell bandgap that is at least equal to said substrate bandgap; and
   at least one lower subcell disposed adjacent to said lower side, said lower subcell being current matched to said active substrate and characterized by a lower subcell lattice constant and a lower subcell bandgap that is not greater than said substrate bandgap.

27. The photovoltaic cell of claim 26, wherein said upper subcell is in contact with said upper side and said upper subcell lattice constant is substantially the same as said substrate lattice constant.

28. The photovoltaic cell of claim 26, wherein said upper subcell is not in contact with said upper side and said upper subcell lattice constant is not substantially the same as said substrate lattice constant.

29. The photovoltaic cell of claim 26, wherein said lower subcell is in contact with said lower side and said lower subcell lattice constant is substantially the same as said substrate lattice constant.

30. The photovoltaic cell of claim 26, wherein said lower subcell is not in contact with said lower side and said lower subcell lattice constant is not substantially the same as said substrate lattice constant.

31. The photovoltaic cell of claim 26, wherein said at least one upper subcell comprises a plurality of groups of upper subcells disposed adjacent said upper side, each of said groups of upper subcells being characterized by a group lattice constant that is different from other ones of said groups and from the substrate lattice constant,
   said photovoltaic cell further comprising:
      one transition layer intermediate said upper side and a lowermost one of said plurality of groups of upper subcells; and
      another transition layer intermediate each group of upper subcells.

32. The photovoltaic cell of claim 31, further comprising:
   a buffer layer above each of said one transition layer and another transition layer.

33. The photovoltaic cell of claim 32, further comprising:
   another buffer layer below each of said one transition layer and another transition layer.

34. The photovoltaic cell of claim 31, wherein the lowermost upper subcell of said plurality of groups of upper subcells has a base with a bandgap at least equal to substrate bandgap, and each of the other ones of said plurality of groups of upper subcells has a base with a bandgap at least equal to that of the upper subcell immediately beneath it.

35. The photovoltaic cell of claim 26, wherein said at least one lower subcell comprises a plurality of groups of lower subcells disposed adjacent said lower side, each of said groups of lower subcells being characterized by a group lattice constant that is different from other ones of said groups and from the substrate lattice constant, said photovoltaic cell further comprising:
a transition layer intermediate said lower side and an uppermost one of said plurality of groups of lower subcells; and
another transition layer intermediate each group of lower subcells.

36. The photovoltaic cell of claim 35, further comprising: a buffer layer above each of said one transition layer and another transition layer.

37. The photovoltaic cell of claim 36, further comprising: another buffer layer below each of said one transition layer and another transition layer.

38. The photovoltaic cell of claim 35, wherein the uppermost subcell of said plurality of groups of lower subcells has a base with a bandgap not greater than said substrate bandgap, and each of the other ones of said plurality of groups of lower subcells has a base with a bandgap not greater than that of the lower subcell immediately above it.

39. The photovoltaic cell of claim 26, further comprising 1 to n number of upper subcells where n is an integer.

40. The photovoltaic cell of claim 26, further comprising 1 to m number of lower subcells where m is an integer.

41. The photovoltaic cell of claim 26, further comprising 1 to j number of p-n junctions or n-p junctions where j is an integer.

42. A multijunction photovoltaic cell, comprising:
an active substrate;
a second upper subcell with one of a GaAs, GaInPAs and GaPAs base, said second upper subcell being adjacent said active substrate, and
a first upper subcell with a GaInP base, said first upper subcell being adjacent said second upper subcell.

43. The photovoltaic cell of claim 42, wherein said active substrate is a SiGe substrate.

44. The photovoltaic cell of claim 42, wherein said active substrate is a Si substrate.

45. The photovoltaic cell of claim 44, wherein said photovoltaic cell comprises a combination of materials selected from the group consisting of
GaInP/GaInPAs/GaAs/Si/Ge;
GaInP/GaInPAs/GaAs/Si/GaSb;
GaInP/GaInPAs/GaAs/Si/GaInAs; and
GaInP/GaInPAs/GaAs/Si/GaAsSb.

46. The photovoltaic cell of claim 44, further comprising
a first buffer layer of GaP disposed between said substrate and said second upper subcell; and
a transition layer comprising a step-graded region of one of GaPAs and GaInP, said transition layer being disposed intermediate said active substrate and said first buffer layer.

47. The photovoltaic cell of claim 46, further comprising a second buffer layer comprising one of GaPAs and GaInP, said second buffer layer being disposed adjacent said transition layer so that said transition layer is between said first buffer layer and said second buffer layer.

48. The photovoltaic cell of claim 43, further comprising:
a first buffer layer comprising one of GaP, GaPAs, and GaInP, said first buffer layer being lattice-matched to and adjacent said active substrate; and
a transition layer comprising a step-graded region of one of GaPAs and GaInP, said transition layer being disposed intermediate said active substrate and said first buffer layer.

49. The photovoltaic cell of claim 48, further comprising:
a second buffer layer comprising one of GaAs, GaPAs and GaInP adjacent to said transition layer.

50. The photovoltaic cell of claim 43, further comprising a third upper subcell with a base selected from the group consisting of GaInAs, GaAsSb, GaAs, SiGe and Ge, said third upper subcell being intermediate said active substrate and second upper subcell.

51. The photovoltaic cell of claim 42, further comprising a lower subcell adjacent a side of active substrate that is opposite said second upper subcell, said lower subcell having a base selected from the group consisting of Ge, GaSb, GaInAs, and GaAsSb.

52. The photovoltaic cell of claim 42, wherein said photovoltaic cell generates electricity from sunlight on a spacecraft.

53. The photovoltaic cell of claim 42, wherein said photovoltaic cell generates electricity in a terrestrial application in which sunlight is either concentrated or not concentrated.

54. The photovoltaic cell of claim 42, wherein said photovoltaic cell generates electricity from thermal radiation in a thermophotovoltaic system.

55. A 3-junction photovoltaic cell, comprising:
an active substrate comprising one of Si and SiGe;
a second upper subcell with one of a GaAs, GaInPAs, and GaPAs base, said second upper subcell being adjacent said active substrate, and
a first upper subcell with a GaInP base, said first upper subcell being adjacent said second upper subcell.

56. The photovoltaic cell of claim 55, wherein said active substrate comprises $Si_{0.17}Ge_{0.83}$, said second upper subcell comprises GaAs, and said first upper subcell comprises $Ga_{0.52}In_{0.48}P$.

57. The photovoltaic cell of claim 55, wherein said active substrate comprises Si, said second upper subcell comprises $GaP_{0.07}As_{0.93}$, and said first upper subcell comprises $Ga_{0.55}In_{0.45}P$.

58. The photovoltaic cell of claim 55, wherein said active substrate comprises Si, said second upper subcell comprises GaAs, and said first upper subcell comprises $Ga_{0.52}In_{0.48}P$.

59. The photovoltaic cell of claim 55, wherein said active substrate comprises Si, said second upper subcell comprises $Ga_xIn_{1-x}P_yAs_{1-y}$, and said first upper subcell comprises $Ga_{0.52}In_{0.48}P$.

60. The photovoltaic cell of claim 55, wherein said active substrate comprises $Si_{0.08}Ge_{0.92}$, said second upper subcell comprises $GaP_{0.07}As_{0.93}$, and said first upper subcell comprises $Ga_{0.55}In_{0.45}P$.

61. The photovoltaic cell of claim 55, wherein said active substrate comprises $Si_{0.17}Ge_{0.83}$, said second upper subcell comprises $GaP_{0.17}As_{0.83}$, and said first upper subcell comprises $Ga_{0.60}In_{0.40}P$.

62. A 4-junction photovoltaic cell, comprising:
an active Si substrate subcell, which is a fourth upper subcell;
a third upper subcell of GaAs that is adjacent said fourth upper subcell;
a second upper subcell of $Ga_xIn_{1-x}P_yAs_{1-y}$ that is adjacent said third upper subcell; and
a first upper subcell of $Ga_{0.52}In_{0.48}P$ that is adjacent said second upper subcell.

63. A 4-junction photovoltaic cell, comprising:
an active Ge substrate subcell, which is a fourth upper subcell;
a third upper subcell comprising one of Si, SiGe, Ge, GaInAs, and GaAsSb that is adjacent said fourth upper subcell;

a second upper subcell comprising one of GaAs, GaPAs, and GaInPAs that is adjacent said third upper subcell; and a first upper subcell comprising GaInP that is adjacent said second upper subcell.

64. The photovoltaic cell of claim 63, wherein:
said third upper subcell comprises Si
said second upper subcell comprises GaAs; and
said first upper subcell comprises $Ga_{0.52}In_{0.48}P$.

65. The photovoltaic cell of claim 63, wherein:
said third upper subcell comprises Si
said second upper subcell comprises $Ga_xIn_{1-x}P_yAs_{1-y}$; and
said first upper subcell comprises $Ga_{0.52}In_{0.48}P$.

66. The photovoltaic cell of claim 63, wherein:
said third upper subcell comprises $Si_{0.02}Ge_{0.98}$;
said second upper subcell comprises GaAs; and
said first upper subcell comprises $Ga_{0.52}In_{0.48}P$.

67. The photovoltaic cell of claim 63, wherein:
said third upper subcell comprises Ge;
said second upper subcell comprises GaAs; and
said first upper subcell comprises $Ga_{0.52}In_{0.48}P$.

68. The photovoltaic cell of claim 63, wherein:
said third upper subcell comprises $Ga_{0.68}In_{0.32}As$;
said second upper subcell comprises $GaP_{0.17}As_{0.83}$; and
said first upper subcell comprises $Ga_{0.60}In_{0.40}P$.

69. The photovoltaic cell of claim 63, wherein:
said third upper subcell comprises $GaAs_{0.79}Sb_{0.21}$;
said second upper subcell comprises $GaP_{0.17}As_{0.83}$; and
said first upper subcell comprises $Ga_{0.60}In_{0.40}P$.

70. The photovoltaic cell of claim 63, wherein:
said third upper subcell comprises $Si_{0.17}Ge_{0.83}$;
said second upper subcell comprises $GaP_{0.17}As_{0.83}$; and
said first upper subcell comprises $Ga_{0.60}In_{0.40}P$.

71. The photovoltaic cell of claim 63, wherein:
said third upper subcell comprises $Si_{0.17}Ge_{0.83}$;
said second upper subcell comprises $GaP_{0.17}As_{0.83}$; and
said first upper subcell comprises $Ga_{0.60}In_{0.40}P$.

72. The photovoltaic cell of claim 63, wherein:
said third upper subcell comprises $Ga_{0.61}In_{0.39}As$;
said second upper subcell comprises GaAs; and
said first upper subcell comprises $Ga_{0.52}In_{0.48}P$.

73. The photovoltaic cell of claim 63, wherein:
said third upper subcell comprises $GaAs_{0.74}Sb_{0.26}$;
said second upper subcell comprises GaAs; and
said first upper subcell comprises $Ga_{0.52}In_{0.48}P$.

74. The photovoltaic cell of claim 63, wherein:
said third upper subcell comprises $Si_{0.17}Ge_{0.83}$;
said second upper subcell comprises GaAs; and
said first upper subcell comprises $Ga_{0.52}In_{0.48}P$.

75. The photovoltaic cell of claim 63, wherein:
said third upper subcell comprises $Ga_{0.89}In_{0.11}As$;
said second upper subcell comprises $GaP_{0.17}As_{0.83}$; and
said first upper subcell comprises $Ga_{0.52}In_{0.48}P$.

76. The photovoltaic cell of claim 63, wherein:
said third upper subcell comprises $Ga_{0.89}As_{0.0}Sb_{0.10}$;
said second upper subcell comprises $GaP_{0.07}As_{0.83}$; and
said first upper subcell comprises $Ga_{0.52}In_{0.48}P$.

77. The photovoltaic cell of claim 63, wherein:
said third upper subcell comprises $Si_{0.17}Ge_{0.83}$;
said second upper subcell comprises GaInPAs; and
said first upper subcell comprises $Ga_{0.52}In_{0.48}P$.

78. A 4-junction photovoltaic cell, comprising:
an active SiGe substrate subcell, which is a fourth upper subcell;
a third upper subcell comprising one of SiGe, Ge, GaAs, GaInAs, and GaAsSb that is adjacent said fourth upper subcell;
a second upper subcell comprising one of GaAs, GaPAs, and GaInPAs that is adjacent said third upper subcell; and
a first upper subcell comprising GaInP that is adjacent said second upper subcell.

79. The photovoltaic cell of claim 78, wherein:
said fourth upper subcell comprises $Si_{0.17}Ge_{0.83}$;
said third upper subcell comprises $Si_{0.17}Ge_{0.83}$;
said second upper subcell comprises $GaP_{0.17}As_{0.83}$; and
said first upper subcell comprises $Ga_{0.60}In_{0.40}P$.

80. The photovoltaic cell of claim 78, wherein:
said fourth upper subcell comprises $Si_{0.02}Ge_{0.98}$;
said third upper subcell comprises $Si_{0.02}Ge_{0.98}$;
said second upper subcell comprises GaAs; and
said first upper subcell comprises $Ga_{0.52}In_{0.48}P$.

81. The photovoltaic cell of claim 78, wherein:
said fourth upper subcell comprises $Si_{0.02}Ge_{0.98}$;
said third upper subcell comprises Ge;
said second upper subcell comprises GaAs; and
said first upper subcell comprises $Ga_{0.52}In_{0.48}P$.

82. The photovoltaic cell of claim 78, wherein:
said fourth upper subcell comprises $Si_{0.17}Ge_{0.83}$;
said third upper subcell comprises $Ga_{0.83}In_{0.17}As$;
said second upper subcell comprises $GaP_{0.17}As_{0.83}$; and
said first upper subcell comprises $Ga_{0.60}In_{0.40}P$.

83. The photovoltaic cell of claim 78, wherein:
said fourth upper subcell comprises $Si_{0.17}Ge_{0.83}$;
said third upper subcell comprises $GaAs_{0.90}Sb_{0.10}$;
said second upper subcell comprises $GaP_{0.17}As_{0.83}$; and
said first upper subcell comprises $Ga_{0.60}In_{0.40}P$.

84. The photovoltaic cell of claim 78, wherein:
said fourth upper subcell comprises $Si_{0.17}Ge_{0.83}$;
said third upper subcell comprises GaAs;
said second upper subcell comprises $GaP_{0.17}As_{0.83}$; and
said first upper subcell comprises $Ga_{0.60}In_{0.40}P$.

85. The photovoltaic cell of claim 78, wherein:
said fourth upper subcell comprises $Si_{0.08}Ge_{0.92}$;
said third upper subcell comprises $Ga_{0.73}In_{0.27}As$;
said second upper subcell comprises $GaP_{0.17}As_{0.83}$; and
said first upper subcell comprises $Ga_{0.55}In_{0.45}P$.

86. The photovoltaic cell of claim 78, wherein:
said fourth upper subcell comprises $Si_{0.08}Ge_{0.92}$;
said third upper subcell comprises $GaAs_{0.83}Sb_{0.17}$;
said second upper subcell comprises $GaP_{0.17}As_{0.83}$; and
said first upper subcell comprises $Ga_{0.55}In_{0.45}P$.

87. The photovoltaic cell of claim 78, wherein:
said fourth upper subcell comprises $Si_{0.08}Ge_{0.92}$;
said third upper subcell comprises GaAs;
said second upper subcell comprises $GaP_{0.17}As_{0.83}$; and
said first upper subcell comprises $Ga_{0.55}In_{0.45}P$.

88. The photovoltaic cell of claim 78, wherein:
said fourth upper subcell comprises $Si_{0.08}Ge_{0.92}$;
said third upper subcell comprises $Si_{0.17}Ge_{0.83}$;
said second upper subcell comprises GaInPAs; and
said first upper subcell comprises $Ga_{0.55}In_{0.45}P$.

89. A multi-junction photovoltaic cell, comprising:
an active Si substrate subcell;
a lower subcell comprising one of Ge and GaSb that is adjacent said substrate subcell;
a third upper subcell comprising one of $Ga_xIn_{1-x}P_yAs_{1-y}$ that is adjacent said substrate subcell; and
a second upper subcell comprising one of GaInP and $Ga_xIn_{1-x}P_yAs_{1-y}$ that is adjacent said third upper subcell.

90. The photovoltaic cell of claim 89, further comprising:
a first upper subcell comprising $Ga_{0.52}In_{0.48}P$ that is adjacent said second upper subcell and wherein:
said lower subcell comprises Ge;
said third upper subcell comprises GaAs; and
said second upper subcell comprises $Ga_xIn_{1-x}P_yAs_{1-y}$.

91. The photovoltaic cell of claim 89, wherein:
said lower subcell comprises GaSb;
said third upper subcell comprises GaAs; and
said second upper subcell comprises $Ga_{0.52}In_{0.48}P$.

92. The photovoltaic cell of claim 89, wherein:
said lower subcell comprises GaSb;
said third upper subcell comprises $Ga_xIn_{1-x}P_yAs_{1-y}$; and
said second upper subcell comprises $Ga_{0.52}In_{0.48}P$.

93. The photovoltaic cell of claim 89, further comprising:
a first upper subcell comprising $Ga_{0.52}In_{0.48}P$ that is adjacent said second upper subcell and wherein:
said lower subcell comprises GaSb;
said third upper subcell comprises GaAs; and
said second upper subcell comprises $Ga_xIn_{1-x}P_yAs_{1-y}$.

* * * * *